United States Patent
Hocevar

(10) Patent No.: US 7,669,109 B2
(45) Date of Patent: *Feb. 23, 2010

(54) HARDWARE-EFFICIENT LOW DENSITY PARITY CHECK CODE FOR DIGITAL COMMUNICATIONS

(75) Inventor: Dale E. Hocevar, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 131 days.

This patent is subject to a terminal disclaimer.

(21) Appl. No.: 11/463,236

(22) Filed: Aug. 8, 2006

(65) Prior Publication Data

US 2007/0011568 A1   Jan. 11, 2007

Related U.S. Application Data

(63) Continuation of application No. 10/329,597, filed on Dec. 26, 2002, now Pat. No. 7,178,080.

(60) Provisional application No. 60/403,668, filed on Aug. 15, 2002.

(51) Int. Cl.
*H03M 13/00* (2006.01)
*H03M 13/03* (2006.01)

(52) U.S. Cl. ............... 714/780; 714/794; 714/795

(58) Field of Classification Search ........... 714/780, 714/794, 795
See application file for complete search history.

(56) References Cited

U.S. PATENT DOCUMENTS 5,406,570 A   4/1995   Berrou et al.
5,446,747 A   8/1995   Berrou et al.
5,563,897 A   10/1996  Pyndiah et al.
5,630,156 A   5/1997   Privat et al.
6,023,783 A   2/2000   Divsalar et al.
6,065,147 A   5/2000   Pyndiah et al.
6,108,388 A   8/2000   Douillard et al.
6,119,264 A   9/2000   Berrou et al.
6,122,763 A   9/2000   Pyndiah et al.

(Continued)

OTHER PUBLICATIONS

Tanner et al. "A Class of Group-Structured LDPC Codes", ISTCA-2001 Proceedings (Ambleside, England, 2001).

(Continued)

*Primary Examiner*—Joseph D Torres
(74) *Attorney, Agent, or Firm*—Steven A. Shaw; W. James Brady; Frederick J. Telecky, Jr.

(57) ABSTRACT

A low density parity check (LDPC) code for a belief propagation decoder circuit is disclosed. LDPC code is arranged as a macro matrix (H) representing block columns and block rows of a corresponding parity check matrix ($H_{pc}$). Each non-zero entry corresponds to a permutation matrix with a shift corresponding to the position of the permutation matrix entry in the macro matrix. The block columns are grouped, so that only one column in the group contributes to the parity check sum in a row. A parity check value estimate memory is arranged in banks logically connected in various data widths and depths. A parallel adder generates extrinsic estimates for generating new parity check value estimates that are forwarded to bit update circuits for updating of probability values. Parallelism, time-sequencing of ultrawide parity check rows, and pairing of circuitry to handle ultrawide code rows, are also disclosed.

16 Claims, 10 Drawing Sheets

U.S. PATENT DOCUMENTS

| | | | |
|---|---|---|---|
| 6,473,010 B1 * | 10/2002 | Vityaev et al. | 341/107 |
| 6,539,367 B1 * | 3/2003 | Blanksby et al. | 706/14 |
| 6,633,856 B2 * | 10/2003 | Richardson et al. | 706/15 |
| 6,895,547 B2 * | 5/2005 | Eleftheriou et al. | 714/801 |
| 6,938,196 B2 * | 8/2005 | Richardson et al. | 714/752 |
| 7,139,959 B2 * | 11/2006 | Hocevar | 714/752 |
| 7,178,080 B2 * | 2/2007 | Hocevar | 714/752 |
| 7,181,676 B2 * | 2/2007 | Hocevar | 714/780 |
| 2003/0033575 A1 | 2/2003 | Richardson et al. | |
| 2003/0043487 A1 | 3/2003 | Morita et al. | |
| 2003/0065989 A1 | 4/2003 | Yedida et al. | |
| 2003/0104788 A1 | 6/2003 | Kim | |

OTHER PUBLICATIONS

Richardson et al., "Design of Capacity-Approaching Irregular Low-Density Parity Check Codes", Trans. on Information Theory, vol. 47, No. 2 (IEEE, Feb. 2001), pp. 619-637.

Zhang et al., "VLSI Implementation-Oriented (3,k)-Regular Low-Density Parity-Check Codes", IEEE Workshop on Signal Processing Systems (Sep. 2001), pp. 25-36.

Boutillon et al., "Decoder-First Code Design", Proc. Int'l Symp. on Turbo Codes and Related Topics (Brest, France, Sep. 2001).

Sridhara et al., "Low Density Parity Check Codes from Permutation Matrices", 2001 Conference on Information Sciences and Systems (Johns Hopkins, Mar. 2001).

Chung et al., "Analysis of sum-product decoding of low-density parity-check codes using a Gaussian approximation", Trans. Information Theory, vol. 47, No. 2 (IEEE, Feb. 2001), pp. 657-670.

Richardson et al., "Efficient Encoding of Low-Density Parity-Check Codes", Trans. Information Theory, vol. 47, No. 2 (IEEE, Feb. 2001), pp. 638-656.

Mackay et al., "Comparison of Constructions of Irregular Gallager Codes", Trans. on Communications, vol. 47, No. 10 (IEEE, 1999), pp. 1449-1454.

* cited by examiner

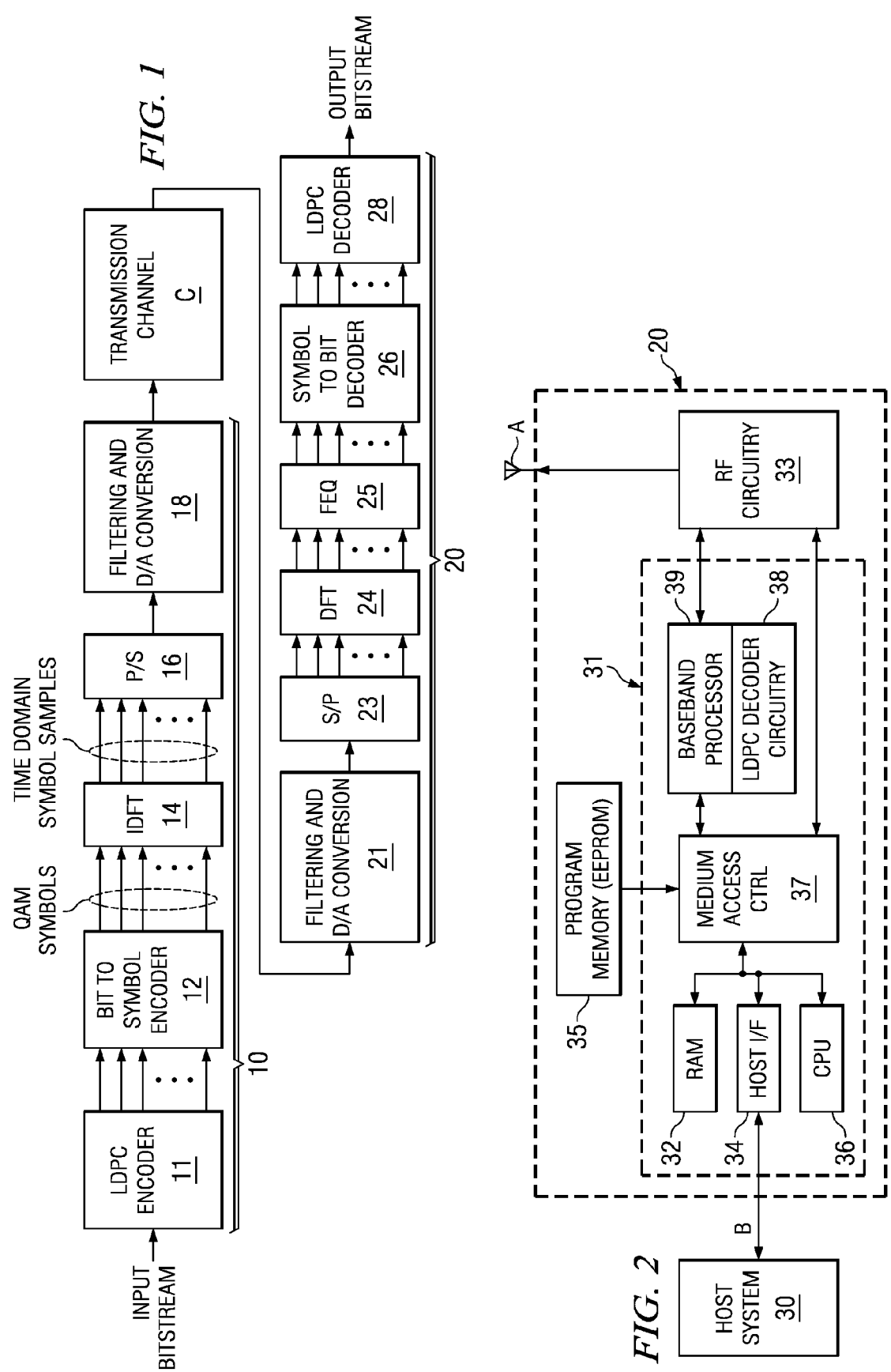

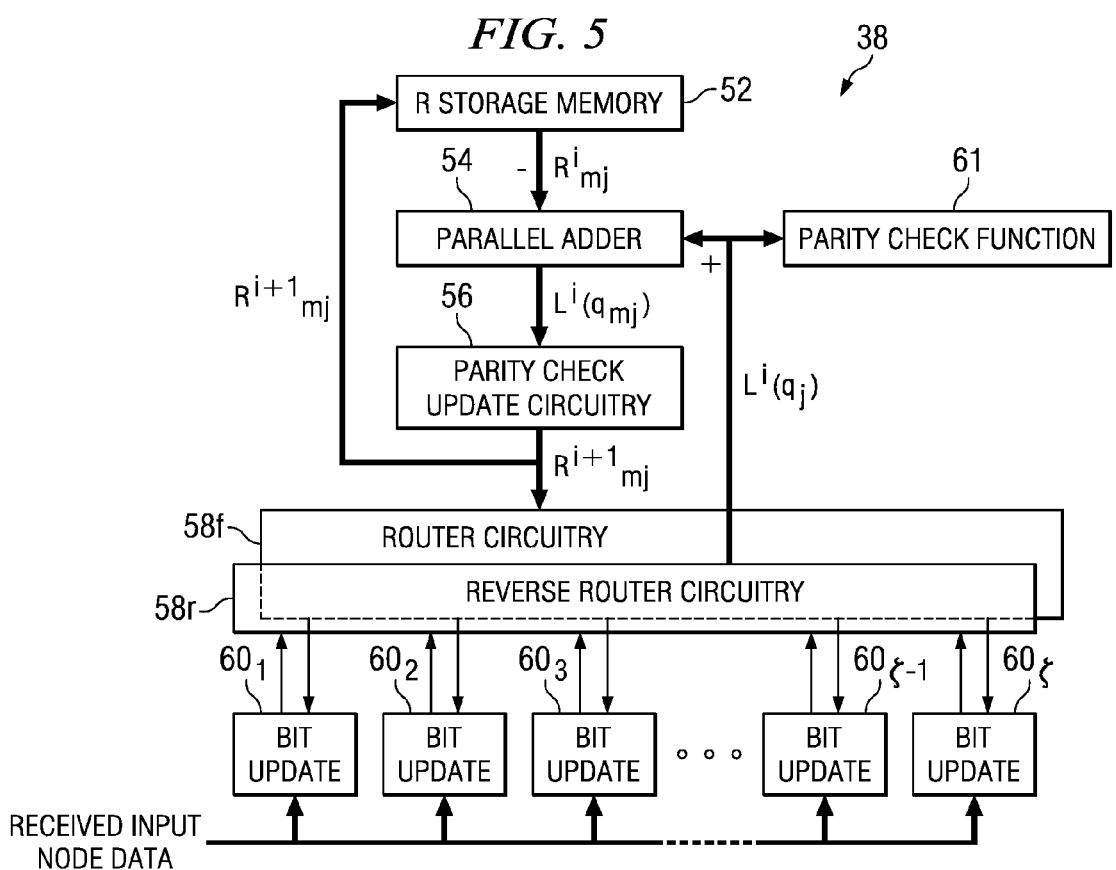

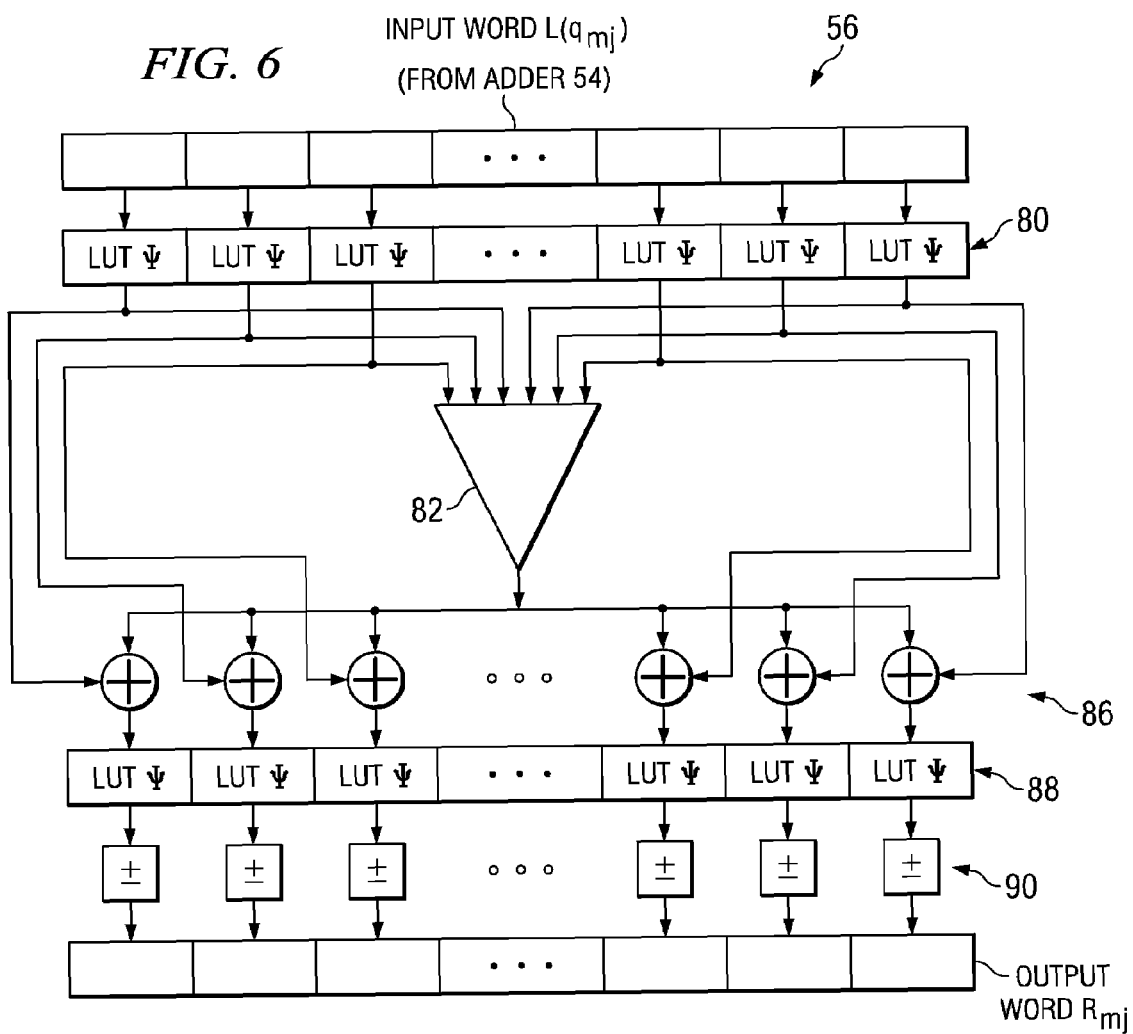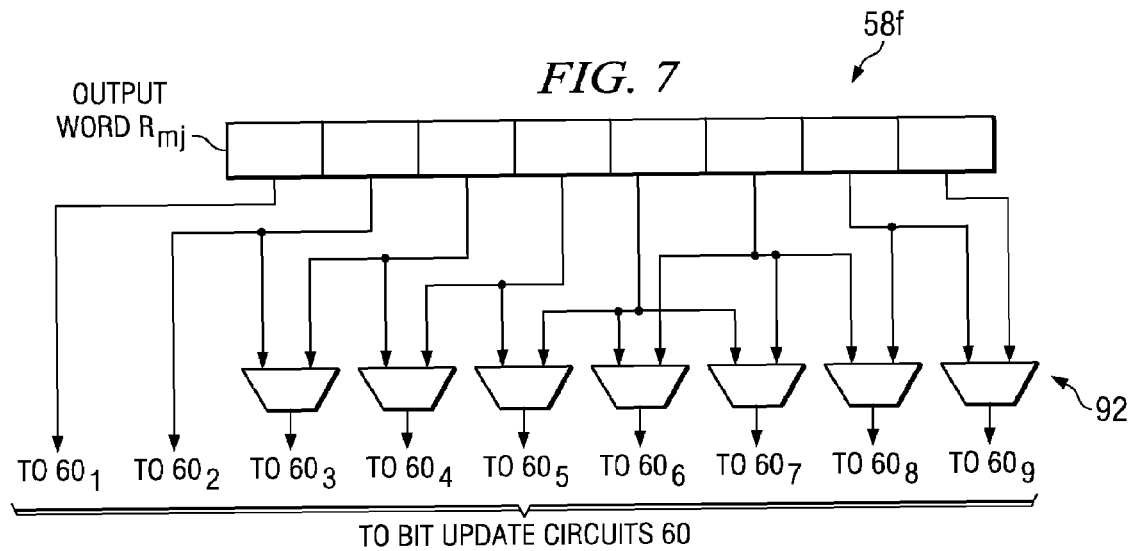

HARDWARE-EFFICIENT LOW DENSITY PARITY CHECK CODE FOR DIGITAL COMMUNICATIONS

CROSS-REFERENCE TO RELATED APPLICATIONS

This application is a continuation of copending U.S. application Ser. No. 10/329,597, filed Dec. 26, 2002, which in turn claims priority, under 35 U.S.C. §119(e), of Provisional Application No. 60/403,668, filed Aug. 15, 2002.

STATEMENT REGARDING FEDERALLY SPONSORED RESEARCH OR DEVELOPMENT

Not applicable.

BACKGROUND OF THE INVENTION

This invention is in the field of digital data communications, and is more specifically directed to redundant coding for error detection and correction in such communications.

High-speed data communications, for example in providing high-speed Internet access, is now a widespread utility for many businesses, schools, and homes. At this stage of development, such access is provided according to an array of technologies. Data communications are carried out over existing telephone lines, with relatively slow data rates provided by voice band modems (e.g., according to the current v.92 communications standards), and at higher data rates using Digital Subscriber Line (DSL) technology. Another modern data communications approach involves the use of cable modems communicating over coaxial cable, such as provided in connection with cable television services. The Integrated Services Digital Network (ISDN) is a system of digital phone connections over which data is transmitted simultaneously across the world using end-to-end digital connectivity. Localized wireless network connectivity according to the IEEE 802.11 standard has become very popular for connecting computer workstations and portable computers to a local area network (LAN), and often through the LAN to the Internet. Wireless data communication in the Wide Area Network (WAN) context, which provides cellular-type connectivity for portable and handheld computing devices, is expected to also grow in popularity.

A problem that is common to all data communications technologies is the likelihood of corruption of data due to noise. As is fundamental in the art, the signal-to-noise ratio for a communications channel is a degree of goodness of the communications carried out over that channel, as it conveys the relative strength of the signal that carries the data (as attenuated over distance and time), to the noise present on that channel. These factors relate directly to the likelihood that a data bit or symbol received over the channel will be in error relative to the data bit or symbol as transmitted. This likelihood is reflected by the error probability for the communications over the channel, commonly expressed as the Bit Error Rate (BER) ratio of errored bits to total bits transmitted. In short, the likelihood of error in data communications must be considered in developing a communications technology. Techniques for detecting and correcting errors in the communicated data must be incorporated for the communications technology to be useful.

Error detection and correction techniques are typically implemented through the use of redundant coding of the data. In general, redundant coding inserts data bits into the transmitted data stream that do not add any additional information, but that indicate whether an error is present in the received data stream. More complex codes provide the ability to deduce the true transmitted data from a received data stream, despite the presence of errors.

Many types of redundant codes that provide error correction have been developed. One type of code simply repeats the transmission, for example repeating the payload twice, so that the receiver deduces the transmitted data by applying a decoder that determines the majority vote of the three transmissions for each bit. Of course, this simple redundant approach does not necessarily correct every error, but greatly reduces the payload data rate. In this example, a predictable likelihood remains that two of three bits are in error, resulting in an erroneous majority vote despite the useful data rate having been reduced to one-third. More efficient approaches, such as Hamming codes, have been developed toward the goal of reducing the error rate while maximizing the data rate.

The well-known Shannon limit provides a theoretical bound on the optimization of decoder error as a function of data rate. The Shannon limit provides a metric against which codes can be compared, both in the absolute and relative to one another. Since the time of the Shannon proof, modern data correction codes have been developed to more closely approach the theoretical limit. An important type of these conventional codes are "turbo" codes, which encode the data stream by applying two convolutional encoders. One convolutional encoder encodes the datastream as given, while the other encodes a pseudo-randomly interleaved version of the data stream. The results from the two encoders are interwoven to produce the output encoded data stream.

Another class of known redundant codes is the Low Density Parity Check code. According to this class of codes, a sparse matrix H defines the code, with the encodings t of the payload data satisfying:

$$Ht=0 \quad (1)$$

over Galois field GF(2). Each encoding t consists of the source message s combined with the corresponding parity check bits for that source message s. The encodings t are transmitted, with the receiving network element receiving a signal vector $r=t+n$, n being the noise added by the channel. Because the decoder at the receiver knows matrix H, it can compute a vector $z=Hr$. However, because $r=t+n$, and because $Ht=0$:

$$z=Hr=Ht+Hn=Hn \quad (2)$$

The decoding process thus involves finding the sparsest vector x that satisfies the equation:

$$Hx=z \quad (3)$$

over GF(2). The vector x becomes the best guess for noise vector n, which can be subtracted from the received signal vector r to recover encodings t, from which the original source message s is recoverable. There have been many examples of LDPC codes that are known in the art, and these LDPC codes have been described as providing code performance that approaches the Shannon limit, as described in Tanner et al., "A Class of Group-Structured LDPC Codes", *ISTCA*-2001 *Proc.* (Ambleside, England, 2001).

In general, high-performance LDPC code decoders are difficult to implement into hardware. In contrast to Shannon's adage that random codes are good codes, it is regularity that allows efficient hardware implementation. To address this difficult tradeoff between code irregularity and hardware efficiency, the technique of belief propagation provides an iterative implementation of LDPC decoding can be made somewhat efficient, as described in Richardson, et al., "Design of Capacity-Approaching Irregular Low-Density Parity Check Codes," *IEEE Trans. on Information Theory*, Vol. 47, No. 2 (February 2001), pp. 619-637; and in Zhang et al., "VLSI Implementation-Oriented (3,k)-Regular Low-Density Parity-Check Codes", *IEEE Workshop on Signal Processing Systems* (September 2001), pp. 25.-36. Belief propagation decoding algorithms are also referred to in the art as probability propagation algorithms, message passing algorithms, and as sum-product algorithms.

In summary, belief propagation algorithms are based on the binary parity check property of LDPC codes. As mentioned above and as known in the art, each check vertex in the LDPC code constrains its neighboring variables to form a word of even parity. In other words, the product of the LDPC code word vector with each row of the parity check matrix sums to zero. According to the belief propagation approach, the received data are used to represent the input probabilities at each input node (also referred to as a "bit node") of a bipartite graph having input nodes and check nodes. Within each iteration of the belief propagation method, bit probability messages are passed from the input nodes to the check nodes, updated according to the parity check constraint, with the updated values sent back to and summed at the input nodes. The summed inputs are formed into log likelihood ratios (LLRs) defined as:

$$L(c) = \log\left(\frac{P(c=0)}{P(c=1)}\right) \quad (4)$$

where c is a coded bit received over the channel.

In its conventional implementation, the belief propagation algorithm uses two value arrays, a first array $L(q_{mj})$ storing the LLRs for the input nodes, and the second array $R_{mj}$ storing the results of the parity check node updates, with m being the parity check row index and j being the column (or input node) index. The general operation of this conventional approach determines, in a first step, the $R_{mj}$ values by estimating, for each check sum (row of the parity check matrix) the probability of the input node value from the other inputs used in that checksum. The second step of this algorithm determines the LLR $L(q_{mj})$ probability values by combining, for each column, the $R_{mj}$ values for that input node from parity check matrix rows in which that input node participated. A "hard" decision is then made from the resulting probability values, and is applied to the parity check matrix. This two-step iterative approach is repeated until the parity check matrix is satisfied (all parity check rows equal zero, GF(2)), or until another convergence criteria is reached, or a terminal number of iterations have been executed.

By way of further background, the code design approach described in Boutillon et al., "Decoder-First Code Design", *Proc.: Int'l Symp. on Turbo Codes and Related Topics* (Brest, France, September 2001) defines the decoder architecture first, and uses this architecture to constrain the design of the LDPC code itself. Sridhara, et al., "Low Density Parity Check Codes from Permutation Matrices", 2001 *Conference on Information Sciences and Systems* (Johns Hopkins University, Mar. 21-23, 2001) describes the LDPC code as constructed from shifted identity matrices (i.e., permutation matrices).

However, it has been observed in connection with this invention, that these prior approaches are somewhat limited, in that these approaches are limited to a single code or a small selection of codes. Practically useful communications receivers require some amount of flexibility in code rates, and in optimizing their operation for varying noise levels and channel conditions.

BRIEF SUMMARY OF THE INVENTION

It is therefore an object of this invention to provide an LDPC decoding scheme which can be efficiently implemented in an integrated circuit.

It is a further object of this invention to provide such a scheme that is flexible over a wide range of code rates.

It is a further object of this invention to provide such a scheme having the capability of parallelism, to provide further efficiencies in operation and construction.

Other objects and advantages of this invention will be apparent to those of ordinary skill in the art having reference to the following specification together with its drawings.

The present invention may be implemented in connection with a network receiver, having a decoder that implements a Low-Density Parity-Check (LDPC) code for retrieving the transmitted message. The LDPC code is implemented according to a parity check matrix consisting of an irregular arrangement of cyclically shifted identity matrices, resulting in an irregular LDPC code that provides performance near the Shannon limit. A decoder architecture for this code includes a group of column sum memories that receive the received input data, and that accumulate and store updated values for the input node predictions. A reversible router block forwards these column, input node, values to a parity check update block, at which multiple predictions are generated for each input node, one prediction for each parity check (row) in which the input node is involved; a prediction memory is also provided for storing these predictions. The outputs of the parity check update block are forwarded through the router, and accumulated in the column sum memories.

According to another aspect of the invention, the invention is implemented by encoding a datastream by applying a systematic block code corresponding to an irregular arrangement of circularly shifted identity matrices.

BRIEF DESCRIPTION OF THE SEVERAL VIEWS OF THE DRAWING

FIG. 1 is a functional block diagram of communications between two OFDM transceivers, where at least the receiving transceiver is constructed according to a first preferred embodiment of the invention.

FIG. 2 is an electrical diagram, in block form, of a transceiver constructed according to the preferred embodiments of the invention.

FIG. 3 is a flow chart illustrating a method of designing an LDPC code according to the preferred embodiments of the invention.

FIGS. 4a and 4b are examples of LDPC code macro matrices according to the preferred embodiments of the invention.

FIG. 5 is an electrical diagram, in block form, of an LDPC decoder according to a first preferred embodiment of the invention.

FIG. 6 is an electrical diagram, in block form, of a parity check and update circuit in the LDPC decoder of FIG. 5, according to the first preferred embodiment of the invention.

FIG. 7 is an electrical diagram, in block form, of an example of routing circuitry in the LDPC decoder of FIG. 5, according to the first preferred embodiment of the invention.

DETAILED DESCRIPTION OF THE INVENTION

Figures 3, 4A:
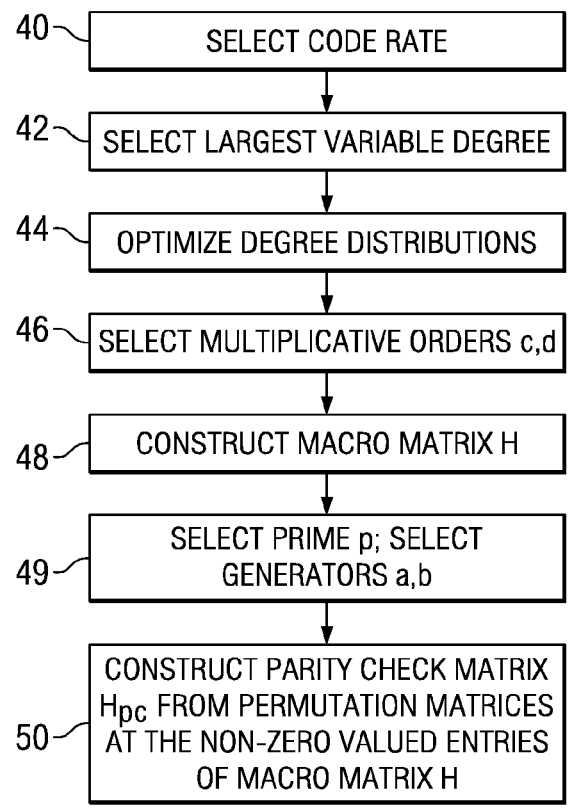

The present invention will be described in connection with an example of its implementation in an exemplary transceiver, for example a wireless network adapter such as according to the IEEE 802.11 wireless standard. It will be apparent to those skilled in the art having reference to this specification that this invention is particularly well-suited for use in such an application. However, it is also contemplated that this invention will be of similar benefit in many other applications that involve error correction coding, including communications according to orthogonal frequency division multiplexing (OFDM), discrete multitone modulation (DMT) for example as used in conventional Digital Subscriber Line (DSL) modems, and other modulation and communication approaches, whether carried out as land line or wireless communications. It is therefore to be understood that these and other alternatives to and variations on the embodiment described below are contemplated to be within the scope of the invention as claimed.

FIG. 1 functionally illustrates an example of a somewhat generalized communication system into which the preferred embodiment of the invention is implemented. The illustrated system corresponds to an OFDM modulation arrangement, as useful in OFDM wireless communications as contemplated for IEEE 802.11 wireless networking. The data flow in this approach is also analogous to Discrete Multitone modulation (DMT) as used in conventional DSL communications, as known in the art. It is contemplated that this generalized arrangement is provided by way of context only. In the system of FIG. 1, only one direction of transmission (from transmitting transceiver 10 over transmission channel C to receiving transceiver 20) is illustrated. It will of course be understood by those skilled in the art that data will also be communicated in the opposite direction, in which case transceiver 20 will be the transmitting transceiver and transceiver 10 the receiving transceiver.

As shown in FIG. 1, transmitting transceiver 10 receives an input bitstream that is to be transmitted to receiving transceiver 20. The input bitstream may be generated by a computer at the same location (e.g., the central office) as transmitting transceiver 10, or alternatively and more likely is generated by a computer network, in the Internet sense, that is coupled to transmitting transceiver 10. Typically, this input bitstream is a serial stream of binary digits, in the appropriate format as produced by the data source.

The input bitstream is received by LDPC encoder function 11, according to this embodiment of the invention. LDPC encoder function 11 digitally encodes the input bitstream by applying a redundant code for error detection and correction purposes. According to this embodiment of the invention, the redundant LDPC code applied by encoder function 11 is selected in a manner that facilitates implementation and performance of the corresponding decoder in receiving transceiver 20. The specifics of the code will become apparent from the description of this decoder function, presented below relative to the description of the construction and operation of receiving transceiver 20. In general, the coded bits include both the payload data bits and also code bits that are selected, based on the payload bits, so that the application of the codeword (payload plus code bits) to the sparse LDPC parity check matrix equals zero for each parity check row. After application of the LDPC code, bit to symbol encoder function 11 groups the incoming bits into symbols having a size, for example, ranging up to as many as fifteen bits. These symbols will modulate the various subchannels in the OFDM broadband transmission.

The encoded symbols are then applied to inverse Discrete Fourier Transform (IDFT) function 14. IDFT function 14 associates each input symbol with one subchannel in the transmission frequency band, and generates a corresponding number of time domain symbol samples according to the Fourier transform. These time domain symbol samples are then converted into a serial stream of samples by parallel-to-serial converter 16. Functions 11 through 16 thus convert the input bitstream into a serial sequence of symbol values representative of the sum of a number of modulated subchannel carrier frequencies, the modulation indicative of the various data values, and including the appropriate redundant code bits for error correction. Typically, for an input of N/2 complex symbols, IDFT function 14 outputs a block of N real-valued time domain samples. Those skilled in the art having reference to this specification will readily recognize that each of functions 11 through 16 may be carried out, and preferably actually are carried out, as digital operations executed by a digital signal processor (DSP).

Filtering and conversion function 18 then processes the datastream for transmission. Function 18 applies the appropriate digital filtering operations, such as interpolation to increase sample rate and digital low pass filter for removing image components, for the transmission. The digitally-filtered datastream signal is then converted into the analog domain and the appropriate analog filtering is then applied to the output analog signal, prior to its transmission.

The output of filter and conversion function 18 is then applied to transmission channel C, for forwarding to receiving transceiver 20. The transmission channel C will of course depend upon the type of communications being carried out. In the wireless communications context, the channel will be the particular environment through which the wireless transmission takes place. Alternatively, in the DSL context, the transmission channel is physically realized by conventional twisted-pair wire. In any case, transmission channel C adds significant distortion and noise to the transmitted analog signal, which can be characterized in the form of a channel impulse response.

This transmitted signal is received by receiving transceiver 20, which, in general, reverses the processes of transmitting transceiver 10 to recover the information of the input bitstream.

FIG. 2 illustrates an exemplary construction of receiving transceiver 20, in the form of a wireless network adapter. Transceiver 20 is coupled to host system 30 by way of a corresponding bus B. Host system 30 corresponds to a personal computer, a laptop computer, or any sort of computing device capable of wireless networking in the context of a wireless LAN; of course, the particulars of host system 30 will vary with the particular application. In the example of FIG. 2, transceiver 20 may correspond to a built-in wireless adapter that is physically realized within its corresponding host system 30, to an adapter card installable within host system 30, or to an external card or adapter coupled to host computer 30. The particular protocol and physical arrangement of bus B will, of course, depend upon the form factor and specific realization of transceiver 20. Examples of suitable buses for bus B include PCI, MiniPCI, USB, CardBus, and the like.

Transceiver 20 in this example includes spread spectrum processor 31, which is bidirectionally coupled to bus B on one side, and to radio frequency (RF) circuitry 33 on its other side. RF circuitry 33, which may be realized by conventional RF circuitry known in the art, performs the analog demodulation, amplification, and filtering of RF signals received over the wireless channel and the analog modulation, amplification, and filtering of RF signals to be transmitted by transceiver 20 over the wireless channel, both via antenna A. The architecture of spread spectrum processor 31 into which this embodiment of the invention can be implemented follows that of the TNETW1100 single-chip WLAN medium access controller (MAC) available from Texas Instruments Incorporated. This exemplary architecture includes embedded central processing unit (CPU) 36, for example realized as a reduced instruction set (RISC) processor, for managing high level control functions within spread-spectrum processor 31. For example, embedded CPU 36 manages host interface 34 to directly support the appropriate physical interface to bus B and host system 30. Local RAM 32 is available to embedded CPU 36 and other functions in spread spectrum processor 31 for code execution and data buffering. Medium access controller (MAC) 37 and baseband processor 39 are also implemented within spread-spectrum processor 31 according to the preferred embodiments of the invention, for generating the appropriate packets for wireless communication, and providing encryption, decryption, and wired equivalent privacy (WEP) functionality. Program memory 35 is provided within transceiver 20, for example in the form of electrically erasable/programmable read-only memory (EEPROM), to store the sequences of operating instructions executable by spread-spectrum processor 31, including the coding and decoding sequences according to the preferred embodiments of the invention, which will be described in further detail below. Also included within wireless adapter 20 are other typical support circuitry and functions that are not shown, but that are useful in connection with the particular operation of transceiver 20.

According to the preferred embodiments of the invention, LDPC decoding is embodied in specific custom architecture hardware associated with baseband processor 39, and shown as LDPC decoder circuitry 38 in FIG. 2. LDPC decoder circuitry 38 is custom circuitry for performing the coding and decoding of transmitted and received data packets according to the preferred embodiments of the invention. Examples of the particular construction of LDPC decoder circuitry 38 according to the preferred embodiment of this invention will be described in further detail below.

Alternatively, it is contemplated baseband processor 39 itself, or other computational devices within transceiver 20, may have sufficient computational capacity and performance to implement the decoding functions described below in software, specifically by executing a sequence of program instructions. It is contemplated that those skilled in the art having reference to this specification will be readily able to construct such a software approach, for those implementations in which the processing resources are capable of timely performing such decoding.

Referring back to the functional flow of FIG. 1, filtering and conversion function 21 in receiving transceiver 20 processes the signal that is received over transmission channel C. Function 21 applies the appropriate analog filtering, analog-to-digital conversion, and digital filtering to the received signals, again depending upon the technology of the communications. In the DSL context, this filtering can also include the application of a time domain equalizer (TEQ) to effectively shorten the length of the impulse response of the transmission channel H. Serial-to-parallel converter 23 converts the filtered datastream into a number of samples that are applied to Discrete Fourier Transform (DFT) function 24. Because, in this OFDM context, the received signal is a time-domain superposition of the modulated subchannels, DFT function 24 recovers the modulating symbols at each of the subchannel frequencies, reversing the IDFT performed by function 14 in transmitting transceiver 10. DFT function 24 outputs a frequency domain representation of a block of transmitted symbols, multiplied by the frequency-domain response of the effective transmission channel. Recovery function 25 then effectively divides out the frequency-domain response of the effective channel, for example by the application of a frequency domain equalizer (FEQ), to recover an estimate of the modulating symbols. Symbol-to-bit decoder function 26 then demaps the recovered symbols, and applies the resulting bits to LDPC decoder function 28.

LDPC decoder function 28 reverses the encoding that was applied in the transmission of the signal, to recover an output bitstream that corresponds to the input bitstream upon which the transmission was based. This output bitstream is then forwarded to the host workstation or other recipient.

LDPC Decoding

The theory of operation of the preferred embodiment of the invention will now be described, following which its implementation into LDPC decoding function 28 in transceiver 20, in the form of LDPC decoder circuitry 38 operating in cooperation with baseband processor 39, will then be described.

By way of nomenclature, the LDPC code is fundamentally contained within an mxj parity check matrix $H_{pc}$ that, when multiplied by the true transmitted code word vector c equals zero:

$$H_{pc} \cdot c = 0 \tag{5}$$

over Galois Field (2). For a single one of the m rows in parity check matrix $H_{pc}$, this parity check amounts to:

$$H_1 c_1 + H_2 c_2 + \ldots + H_j c_j = 0 \tag{6a}$$

over GF(2). In the LDPC code according to the preferred embodiments of the invention, the parity check matrix $H_{pc}$ is formed from a composite of circularly shifted identity matrices represented by a macro matrix H. Each entry in macro matrix H represents a permutation matrix (e.g., a circularly shifted identity matrix), and in this example takes either a 1 or a 0 value. As will be described below, an entry with a 1 value in macro matrix H symbolizes a pxp permutation matrix at that position within parity check $H_{pc}$, while entries with a 0 value symbolize a pxp zero matrix. The parity-check equation thus logically becomes, for an exemplary row of matrix $H_{pc}$ having a "1" in its columns 1, 3, 4, and 7:

$$c_1 \oplus c_3 \oplus c_4 \oplus c_7 = 0 \tag{6b}$$

Once the coding matrix $H_{pc}$ is defined, the encoding of a message frame is relatively straightforward, as known in the art, and can easily be performed by conventional programmable integrated circuits such as digital signal processors and the like. According to the preferred embodiments of the invention, the circularly shifted identity matrices are tiled within macro matrix H in an irregular manner, as will be described below, to provide excellent coding performance.

On the decoding side, one can define a set N(m) as the set of all bit indices (columns) in a given row m for which codeword bits contribute to the checksum (i.e., all bit indices for which the entries of parity check matrix $H_{pc}$ in row m are 1). The checksum equation for a row of the parity check can be expressed as:

$$\sum_{n \in N(m)} c_n = 0 \tag{7}$$

over GF(2) or, logically, the exclusive-OR of the input bits $c_j$ that correspond to column bits in the row having a 1 value. One can thus determine, for a given codeword vector c, whether an error is present by determining whether this equation is true for each row of the parity check matrix $H_{pc}$.

In practice, however, the actual input bit values $r_j$ that are recovered after demodulation and that are to be interpreted as codeword vector c by a decoder, for example by decoding function 28 in transceiver 20 of FIG. 1, are not binary values. Rather, these bit values are expressed as a fractional value, for example between zero and one, expressed in several bits (e.g., six or seven). In effect, the input bit values $r_j$ can be considered as, and converted to, probabilities that their respective bit is a 0 (or conversely a 1). As known in this art, the log likelihood ratio (LLR) is a commonly used representation for these probabilities:

$$L(r_j) = \log\left(\frac{P(c_j = 0)}{P(c_j = 1)}\right) \tag{8}$$

which can of course take negative and positive values, corresponding to 1 and 0 being more likely, respectively. For this description of the preferred embodiment of the invention, one can assume that the incoming LLRs (i.e., the received data) have the form $-2r_j/\sigma^2$ where $\sigma^2$ represents channel noise variance.

Fundamentally, the LDPC decoding process according to the preferred embodiments of the invention involves an iterative two-step process:
1. Estimate a value $R_{mj}$ for each of the j input nodes, for each of the m rows of the checksum, using the current probability values from the other input nodes, setting the result of the checksum for the row to 0; and
2. Update the sum $L(q_j)$ for each of the j input nodes from a combination of the m values of $R_{mj}$ in the same column.

The iterations continue until a termination criterion is reached. A preferred termination criteria is the earlier of (i) evaluation of the matrix operation $H_{pc} \cdot c = 0$ (mod 2), using "hard" decisions from the LLRs $L(r_j)$ as the codeword vector c, and (ii) completion of a specified number of iterations.

Mathematically, for the first step of estimating values $R_{mj}$ for each of the j input nodes, for each of the m rows of the checksum, one can derive an amplitude $A_{mj}$ and a sign value $s_{mj}$ as follows:

$$A_{mj} = \sum_{n \in N(m); n \neq j} \Psi(L(q_{mn})) \tag{9}$$

where the function $\Psi$ is defined as:

$$\Psi(x) \equiv \log(|\tan h(x/2)|) = \log(\tan h|x/2|) \tag{10}$$

The function $\Psi$ is its own negative inverse: $\Psi(\Psi(x)) = -|x|$. For computational ease, one can express tanh(L/2) as:

$$\tanh\left(\frac{L}{2}\right) = \left(\frac{e^L - 1}{e^L + 1}\right) \tag{11}$$

The sign is determined from:

$$s_{mj} = \prod_{n \in N(m); n \neq j} sgn(L(q_{mn})) \tag{12}$$

which is simply an odd/even determination of the number of negative probabilities, excluding each row's own contribution. The updated estimate of values $R_{mj}$ is thus:

$$R_{mj} = -s_{mj} \Psi(A_{mj}) \tag{13}$$

The negative sign of value $R_{mj}$ contemplates that the function $\Psi$ is its own negative inverse. The value $R_{mj}$ thus corresponds to an estimate of the LLR for input node j as derived from the other input nodes in the mth row of the parity check matrix, except input node j itself.

An alternative computation of the estimate values $R_{mj}$ can be defined as a special summation:

$$R_{mj} = \sum_{n \in N(m); n \neq j} [+] L(q_{mn}) \tag{14}$$

where the LLR addition [+] is defined as:

$$L(q_u)[+]L(q_v) \equiv \log\left(\frac{1 + e^{(L(q_u) + L(q_v))}}{e^{L(q_u)} + e^{L(q_v)}}\right) \tag{15}$$

This alternative determination of the estimate values $R_{mj}$ may be easier to implement into some integrated circuit architectures. The selection of the computations may be made by those skilled in the art having reference to this specification, and confronted by a particular technology and decoding application.

In the second step of each decoding iteration, the LLR estimates for each input node are updated. For each column (i.e., each input node):

$$L(q_j) = \sum_{m \in M(j)} R_{mj} + \left(\frac{-2r_j}{\sigma^2}\right) \tag{16}$$

where the set M(j) is the set of all check sum indices (rows) for a given column j of check sum equations to which input bit j contributes to the checksum (i.e., all row indices for which the entries of parity check matrix $H_{pc}$ in column j are 1). This operation effectively sums the estimated values $R_{mj}$ over the jth column, and adds in the original received input node value $$\frac{-2r_j}{\sigma^2}$$

to form the best full estimate of the LLR for input node j in this iteration. This column estimate will be used in the hard decision check. In preparation for the next iteration, the per-row (or extrinsic) LLR probabilities are then derived:

$$L(q_{mj}) = L(q_j) - R_{mj} \qquad (17)$$

for each column j in each row m. The per-row probabilities thus amount to an estimate for the probability of the input value, excluding the contribution to the estimate for each row from the row itself.

As noted above, the determination of whether the iterations have converged to an error free decoding is based on the per-column LLRs $L(q_j)$:

$$L(q_j) \geq 0, \Rightarrow c_j = 0 \qquad (18a)$$

$$L(q_j) < 0, \Rightarrow c_j = 1 \qquad (18b)$$

The codeword vector $c = \{c_0, c_1, \ldots c_N\}$ is then applied to the parity check matrix H to determine if the product is zero, which as noted above indicates that codeword vector c is a valid codeword, from which the payload data portion can be readily extracted.

In practice, for those value arrays $R_{mj}$, $L(q_{mj})$, $A_{mj}$ that are used in the algorithm, the computations performed and the non-zero array values occur only at those index positions (m,j) in parity check matrix $H_{pc}$ where a "1" value appears. Also in practice, the initialization of the array $L(q_{mj})$ can be arbitrary. For example, each of the $L(q_{mj})$ values can be initialized to zero, or to the input values $-2r_j/\sigma_2$, as desired.

According to the preferred embodiment of the invention, an LDPC code is used for encoding data to be transmitted which has the benefits of performing near the Shannon limit, while being implementable in a very efficient manner. The encoding function according to this preferred embodiment of the invention will be described in detail below. However, it is the decoding operation that requires significant computational power, considering that the received datastream is expected to include some frequency of errors, as evident by the use of redundant coding to begin with. Accordingly, the computational complexity and performance of decoding circuitry has significant practical importance, and is often the deciding factor in whether a particular code is practically useful. It will therefore be useful, for purposes of this description, to first describe the code in terms of the decoding algorithm and architecture, prior to describing the encoding function itself, following a description of the code derivation in general terms.

FIG. 3 illustrates a method of deriving an LDPC code according to the preferred embodiments of the invention. It is contemplated that the particular construction of the LDPC codes according to this invention will become apparent from the manner in which these codes are constructed. In process 40, the code rate is selected. This code rate selection of course depends upon the usual factors involved in the communications, including the expected noise level on the channel, the bit-error-rate (BER) performance that is desired, and of course the desired data rate. According to the preferred embodiments of the invention, data rates of ½ and ⅓ are contemplated. However, as will become apparent to those skilled in the art having reference to this description, this invention permits a wide range of flexibility in the selection and implementation of the redundant code, and as such a wide range of data rates are contemplated.

In process 42, the largest input node degree, or variable degree, for the code is selected. As known in the art, this maximum input node degree corresponds to the largest number of checksum rows that involves a given input node; for LDPC codes such as used in this embodiment of the invention, this input node degree corresponds to the maximum number of parity checks that any input node contributes to. While larger input node degrees are desirable, for better error correction capability, the input node degree is ultimately constrained by the hardware implementation. In the examples of the preferred embodiments of the invention described in this specification, the largest variable degree is contemplated to be on the order of ten to twenty.

In process 44, the degree distributions within parity check matrix $H_{pc}$ are optimized. These degree distributions refer to (i) the input node degree distribution, which is the number of check nodes that each input node contributes to, and (ii) the check node degree distribution, which is the number of input nodes that each check node receives. Regular LDPC codes are those for which all nodes of the same type have the same degree. According to the preferred embodiment of the invention, however, irregular LDPC codes are used, to improve error rate performance, and as such each code will have a distribution of degrees over its input nodes, and possibly also over its check nodes. A preferred example of an optimization tool for process 46 is a web-based tool known as "ldpcopt", which is readily available at http://lthcwww.epfl.ch/research/ldpcopt/ and is described in Richardson et al., "Design of Capacity-Approaching Irregular Low-Density Parity-Check Codes", Transactions on Information Theory, Vol. 47, No. 2 (IEEE, February 2001), pp. 619-637; and in Chung, et al., "Analysis of sum-product decoding of low-density parity-check codes using a Gaussian approximation", Transactions on Information Theory, Vol. 47, No. 2 (IEEE, February 2001), pp. 657-670; both incorporated herein by this reference. The optimization criteria used by this exemplary process minimizes the bit error rate for the code, by varying the variable degrees of the LDPC parity check matrix. The results of the optimization provide the optimum numbers of "1" values (but not position) in parity check matrix $H_{pc}$, in the form of optimum numbers of "blocks" within its defining macro matrix H.

According to the preferred embodiments of the invention, as briefly mentioned above, the parity check matrix $H_{pc}$ is determined through the use of a macro matrix H. Macro matrix H is a matrix, of dimensions c by d, in which each entry ("block") indicates the position of a p×p matrix in parity check matrix $H_{pc}$, and in which the value of each entry symbolizes the form of the corresponding p×p matrix at that position. As a result, parity check matrix $H_{pc}$ has a total number of rows m=p×c and a total number of columns j=p×d. Each row of macro matrix H thus defines a "block row" of p rows in parity check matrix $H_{pc}$; conversely, each column of macro matrix H defines a "block column" of p columns in parity check matrix $H_{pc}$. As such, this description will refer to rows of macro matrix H as "block rows", and columns of macro matrix H as "block columns". In the preferred embodiments of this invention, a zero value of an entry in macro matrix H symbolizes a zero-valued p×p matrix (i.e., all entries in the p×p matrix are zero). A non-zero value (e.g., 1) of an entry in macro matrix $H_{pc}$ symbolizes the location of a permutation matrix, which in the preferred embodiments of the invention is a cyclically (or circularly) shifted identity matrix.

The optimization of process 44 determines, for a given macro matrix H of c block rows and d block columns, the distribution of the "1" values within the matrix. Specifically, the distribution determines the number of block columns of macro matrix H that have each of a range of numbers of "1" values, and the number of block rows of macro matrix H that have each of a range of numbers of "1" values. By way of definition, the block rows and block columns refer to the illustration of macro matrix H that indicates the locations of the permutation matrices by "1" values. Once the optimization of process 44 is performed, the specific size of c block rows and d block columns is selected in process 46 as shown in FIG. 3. Alternatively, one may select the numbers of c block rows and d block columns prior to optimization process 44. In either case, the optimization of process 44 can be illustrated by way of examples.

A first example has the following parameter values for a code rate of ½:

| c | d | p | a | b |
|---|---|---|---|---|
| 12 | 24 | 193 | 7 | 49 |

In this example, the optimization of process 44, performed by way of the "ldpcopt" program, provides the following distributions of column blocks:

| g | 2 per column | 3 per column | 4 per column | 11 per column |
|---|---|---|---|---|
| Optimum | 10.80 | 8.90 | 0.74 | 3.56 |
| Useful | 11 | 9 | 1 | 3 |

In this table, the value g is the number of "1" bits in a given block column. As shown in this example, the optimization indicates that the optimum distribution of its twenty-four block columns (d=24) would have 10.80 block columns with two "1" bits, 8.9 block columns with three "1" bits, 0.74 block columns with four "1" bits, and 3.56 block columns with eleven "1" bits. Of course, this arrangement is not possible for a single macro matrix H having discrete rows and columns. As such, the "Useful" values in this table have rounded the optimum value to integer values.

Optimization process 44 also provides an optimized allocation of row blocks, by providing an optimized selection of the number of block rows that have varying numbers of "1" values. In this same first example, the optimization process provided the following results:

| g | 7 per row | 8 per row |
|---|---|---|
| Optimum | 5.56 | 6.64 |
| Useful | 10 | 2 |

As evident from this table, the optimum distribution provided for 5.56 block rows with seven "1" bits in each row, and 6.64 block rows with eight "1" bits in each row, for a total of c=12 rows. The wide variation for the "Useful" allocation from the optimum is due to the number of filled "1" blocks defined for the columns, which is incompatible with the number of filled blocks defined by the optimized allocation of block rows. In this example, the "Useful" column allocation establishes that there are eighty-six filled block matrix entries; the only combination of row allocations that satisfies that optimized column allocation, while maintaining either seven or eight filled "1" blocks in each row, is the "Useful" allocation of ten block rows with seven "1" bits each, and two block rows with eight "1" bits each, as shown in this table. Alternatively, one could arrange the matrix to satisfy the optimum row allocation and adjust the column allocation. FIG. 4a illustrates a macro matrix H constructed according to the arrangement of this example.

According to a second example, for a code rate of ⅓, the parameters are as follows:

| c | d | p | a | b |
|---|---|---|---|---|
| 16 | 24 | 241 | 2 | 44 |

In this example, the optimization of process 44, performed by way of the "ldpcopt" program, provides the following distributions of column blocks:

| g | 2 per column | 3 per column | 5 per column | 15 per column |
|---|---|---|---|---|
| Optimum | 13.22 | 5.73 | 3.17 | 1.88 |
| Useful | 13 | 6 | 3 | 2 |

This optimum distribution of the twenty-four block columns (d=24) is approximated, in this case, by relatively close rounding of the optimum counts to the nearest integer. The row allocation in this example is as follows:

| g | 5 per row | 6 per row |
|---|---|---|
| Optimum | 8.73 | 7.27 |
| Useful | 9 | 7 |

In this case, the optimum distribution of the sixteen (c=16) block rows is also closely approximated by rounding to the nearest integers, as shown in the "Useful" row of the table. In this case, the optimized block row and block column allocations are compatible. FIG. 4b illustrates an example of macro matrix H according to this optimization.

In process 46, if not previously selected prior to optimization process 44, the multiplicative orders c, d are defined, in which order value c and order value d correspond to the number of block rows and block columns, respectively, in macro matrix H, as described above.

In process 48, the code designer next constructs the particular arrangement of macro matrix H according to the optimization results of process 44, and according to additional constraints according to this embodiment of the invention. According to the preferred embodiments of the invention, the macro matrix H is arranged in groups of block columns, so that, for any given block row in macro matrix H, at most one block column within each group has a filled "1" entry. This arrangement must take into account the manner in which the constituent matrices are developed.

FIGS. 4a and 4b illustrate examples of macro matrix H, following the two optimization examples described above.

Each of FIGS. 4a and 4b illustrates macro matrix H representing a matrix of matrices. Each entry of macro matrix H itself represents a square matrix of dimensions p×p. Each empty entry ("0") of macro matrix H constitutes an empty p×p matrix (all entries are "0"). Each filled entry ("1") of macro matrix H constitutes a permutation p×p matrix, each formed as an identity matrix with its rows cyclically shifted (modulo p), by an amount $P_{s,t}=b^s a^t$, where s, t represent the row and column positions, respectively, of the permutation matrix within macro matrix H, and a, b are the generator values. Referring to FIG. 3, these additional code parameters p, a, b, are selected in process 49. These parameters include prime number p that defines the size of the constituent matrices within macro matrix H, and the generators a, b that are used in the definition of the constituent matrices within macro matrix H. Generator a is selected to have multiplicative order d with respect to prime p, and generator b has multiplicative order c also with respect to prime p. The set of parameters p, c, d, define the size of parity check matrix $H_{pc}$, with the total number of rows m=p×c and the total number of columns j=p×d, and thus define the appearance of the LDPC code.

As noted above, generator a is selected to have multiplicative order d, and generator b has multiplicative order c. In process 50, these cyclically shifted identity matrices are then generated for each of the filled "1" locations of macro matrix H, to produce parity check matrix $H_{pc}$. As mentioned above, parity check matrix $H_{pc}$ thus has m=p×c rows and j=p×d columns, with the "1" values determined by generators a, b. The manner in which the permutation matrices are formed is described in Sridhara, et al., "Low Density Parity Check Codes from Permutation Matrices", 2001 *Conference on Information Sciences and Systems* (Johns Hopkins University, Mar. 21-23, 2001), incorporated herein by this reference.

In contrast to the Sridhara approach, however, macro matrix H according to the preferred embodiments of this invention is irregular, in that it is itself relatively sparse, including many zero-valued entries. As will be evident from the following description, the irregularity included by the code designer in process 48, in combination with grouping of block columns of macro matrix H, provides a high performance LDPC code that can be efficiently implemented in hardware.

It is also contemplated, in connection with this invention, that the cyclic shifts of the identity matrices corresponding to the row and column position of macro matrix H need not follow this particular approach. Indeed, the offset $P_{s,t}$ of the cyclic shift within a particular permutation matrix can be an arbitrary selection. Such arbitrary assignment, if followed, may affect the ultimate dimensions of macro matrix H.

The examples of FIGS. 4a and 4b illustrate irregular macro matrices H constructed according to this embodiment of the invention. The irregularity and the block construction is evident from these two LDPC code macro matrices H. It is contemplated that those skilled in the art, having reference to this specification, will be readily able to construct macro matrices and the resulting corresponding parity check matrices in this manner, for other code rates and performance optimization levels.

Referring now to FIG. 5, the construction of LDPC decoder 38 according to a preferred embodiment of the invention will now be described in detail. While it is also contemplated, according to this invention, that the LDPC decoding operations described herein may alternatively be performed as a software routine, for example by baseband processor 39 in the form of a DSP or another programmable logic device executing a sequence of program instructions, the exemplary architecture of FIG. 5 is especially well-suited to the irregular LDPC codes described above, and provide the important benefit of efficient and rapid performance of the iterative belief propagation decoding described above.

As shown in FIG. 5, LDPC decoder 38 includes memory 52, which is preferably a local random access memory (RAM) for storing the $R_{mj}$ estimates that are derived within each iteration of the belief propagation. These $R_{mj}$ estimates are packed into memory 52, so that the column positions within memory 52 do not physically align with the column positions within parity check matrix $H_{pc}$, to save chip area considering the sparseness of matrix H. R storage memory 52 has an output coupled to one input of parallel adder 54. Specifically, this output of R storage memory 52 is connected to a negative input of parallel adder 54, to provide the subtrahend for a subtraction performed by parallel adder 54. The output of parallel adder 54 is applied to parity check update circuitry 56. Parity check update circuitry 56 performs the updating of estimates $R_{mj}$ for each of the parity check nodes, as will be described in further detail below. As such, the output of parity check update circuitry 56 is applied to R storage memory 52, for storage of the updated values; in addition, the output of parity check update circuitry 56 is also applied to router circuitry 58f, for use in updating the log likelihood ratios (LLRs) of the input nodes.

Router circuitry 58f is a bank of multiplexers and demultiplexers, as will be described in further detail below, that forwards the appropriate estimate terms $R_{mj}$ to the corresponding bit update circuits 60. Bit update circuits 60 are effectively accumulators, by way of which current values of the LLRs of the input nodes are maintained from iteration to iteration. The number of bit update circuits 60 depends upon the maximum number of groups of block columns of macro matrix H. In the particular code; for the code example of FIG. 4a, nine bit update circuits 60 will be provided, while for the code example of FIG. 4b, seven bit update circuits 60 are necessary. The specific construction of bit update circuits 60 will be described in further detail below.

Bit update blocks 60 receive the input node data values, prior to the first iteration of the belief propagation. As mentioned above, the received input node data values are typically based on a multiple bit fractional value, for example expressed in six or seven bits, as produced after demodulation and recovery after frequency domain equalization (e.g., by functions 26 and 27 of FIG. 1). More specifically, because LDPC decoder 38 operates on LLRs, the initial input node data value is preferably expressed as the ratio $$\frac{-2r_j}{\sigma^2},$$

the value $r_j$ being the received data value. Bit update blocks 60 each forward an output to reverse router circuitry 58r, which in turn applies the output value to parallel adder 54, as minuends for the subtraction performed by that circuit. In addition, the outputs of bit update blocks 60 are also applied by reverse router circuitry 58r to parity check function 61, which performs a slicing function on these estimates, and after converting these values to "hard" decisions, determines whether the parity check equation is satisfied by the current estimates for each row of parity check matrix $H_{pc}$.

Referring now to FIG. 5 in combination with FIGS. 6 through 8, the operation of LDPC decoder 38 in performing belief propagation decoding according to the preferred embodiment of the invention will now be described in further detail. The specific construction of constituent circuit blocks and functions within decoder 38 will also be described in connection with this operational description. For the sake of clarity, this description will first be provided with respect to an arbitrary selected iteration in the process. The initialization of the belief propagation operation begins with the storage of values corresponding to ratio $$\frac{-2r_j}{\sigma^2},$$

the value $r_j$ being the received data value, stored in the appropriate memory locations as the initial estimate of the LLRs for the columns.

This description of the operation of LDPC decoder 38, and the detailed construction of its functional blocks, for this exemplary iteration, will begin at parallel adder 54. Parallel adder 54 receives the current estimates $R^i_{mj}$ for the participating columns in a given row m of macro matrix H, from memory 52. These current estimates $R^i_{mj}$, which were generated in the previous iteration i of the process, are subtracted from the current LLR values $L(q_j)$ of the input nodes that participate in the current row m of parity check matrix $H_{pc}$, thus generating the LLR values $L(q_{mj})$ according to Equation (17) described above. These values $L(q_{mj})$ are forwarded to parity check update circuitry 56, the construction of which will be described in detail relative to FIG. 6.

The updating process as carried out by parity check update circuitry 56 begins with the application of each of the values $L(q_{mj})$ in the input word received from parallel adder 54 to look-up tables (LUTs) 80, by way of which the Ψ function of Equation (10) is evaluated for each of the values $L(q_{mj})$ within the current row m. The outputs of LUTs 80 are forwarded to augmented adder tree 82, which performs the summing of the values Ψ($L(q_{mj})$) over all of the columns participating in the current row m of macro matrix H. Augmented adder tree 82 effects this summation in a manner that can be readily implemented by those skilled in the art having reference to this specification. This overall sum result is applied to an input of adders 86, one adder 86 associated with each of the columns j contributing to the current row m. Each adder 86 also receives, at a negative input, the output of its corresponding LUT 80, and thus subtracts the column's own contribution from the overall sum. The outputs of adders 86 thus present the set of amplitude values $A_{mj}$ corresponding to the result of Equation (9), each associated with one of the columns j that are participating in this row. The outputs of adders 86 are then again applied to corresponding LUTs 88, to again apply the Ψ function to the amplitude values $A_{mj}$, according to Equation (13). Sign correction functions 90 apply the appropriate sign to the output of LUTs 88, based on the logical combination of the sign bit outputs of LUTs 80 for the corresponding column according to an odd/even determination of the number of negative probabilities, excluding each row's own contribution, as described above relative to Equation (12), and effecting the negative sign applied according to Equation (13). It is this handling of the sign bit outputs of LUTs 80 that corresponds to the augmented addition performed by augmented adder tree 82. Sign correction functions 90 thus present each of the updated estimate values $R^{i+1}_{mj}$ as updated for this, the i+1 iteration.

Alternatively, parity check update circuitry 56 may instead follow the approach described above in connection with Equations (14) and (15). According to this approach, LUTs 80, 88 for applying the Ψ function are not used, but instead a special addition function [+] of Equation (15) is applied to the $L(q_{mj})$ values, and these values are summed according to Equation (14), to derive the updated estimate values $R^{i+1}_{mj}$ for the i+1 iteration. Variations of these parity check update approaches, and other alternative parity check update approaches, may also be realized within parity check update circuitry 56, within LDPC decoding circuitry 38 according to this invention. The selection of the particular arithmetic approach will depend upon the available circuitry and performance of the specific implementation.

Referring back to FIG. 5, these updated estimate values $R^{i+1}_{mj}$ for the i+1 iteration are applied to memory 52, to overwrite the previous estimate values $R^i_{mj}$ from the prior iteration. This effectively completes the first step of the belief propagation algorithm, for this row of parity check matrix $H_{pc}$, with the updating of the estimates of the column value in a row, based on the other column values involved in the same row (i.e., the same parity check equation).

The second step of the belief propagation algorithm, in which the input node estimates (in the form of the LLRs) are updated, begins with the application of these updated estimate values $R^{i+1}_{mj}$ to the appropriate bit update circuit 60, via router and reverse router circuitry 58. The construction of router and reverse router circuitry 58 preferably depends upon the particular code arrangement, either by way of hard wiring or alternatively by way of a software controlled logic arrangement.

FIG. 7 illustrates an example of routing circuitry 58f. Reverse routing circuitry 58r can be constructed in a similar fashion, but reversed to route signals in the opposite direction, as will be apparent to those skilled in the art having reference to this embodiment of the invention. As illustrated in FIG. 7, the output word of the estimates $R_{mj}$ from parity check update circuitry 56 includes several values, each for one of the columns j that are involved in the current row of parity check matrix $H_{pc}$. Referring back to FIGS. 4a and 4b, it is apparent that the number of columns involved in a particular row (i.e., the degree of the row) can vary. As such, the number of positions in the output word from parity check update circuitry 56 can also vary from row to row. As such, there may be instances in which one or more of the positions of the output word from parity check update circuitry 56 may be empty.

Routing circuitry 58f thus consists of a set of multiplexers 92, which effect the forwarding of the values $R_{mj}$ of the output word to the appropriate bit update circuit 60. Knowledge of the particular code arrangement within macro matrix H defines the control of these multiplexers 92 because, according to the preferred embodiments of this invention, macro matrix H is constructed with column block grouping, by way of which only one possible column of parity check matrix $H_{pc}$ is involved within each column block group, for any given row. The example of routing circuitry 58f illustrated in FIG. 7 corresponds to the code shown in FIG. 4a, which has nine groups of column blocks, and thus involves nine positions that are applied to the nine bit update circuits $60_1$ through $60_9$.

In this example, the left-most column block group of macro matrix H of FIG. 4a has a filled "1" for every row, considering that each "1" in the matrix of FIG. 4a corresponds to a sliding identity permutation matrix. As such, the left-most position of the output word from parity check update circuit 56 is always forwarded to bit update circuit $60_1$. The second-most position of the output word may be forwarded either to the second bit update circuit $60_2$ or to the third bit update circuit $60_3$, depending on the code row. In any event, the control of multiplexers 92 is effected depending upon the contributions from the various column block groups to the parity check code, in each row; it is contemplated that multiplexers 92 will be switched to some extent as the process advances from one block row to another. According to this embodiment of the invention, the assignment of the positions of the output word to the various bit update circuits 60 can thus be greatly simplified with knowledge of the code, so that router circuitry 58f and reverse router circuitry 58r need not be overwhelmingly complex. In addition, this embodiment of the invention reduces the number of necessary bit update circuits 60 greatly, from what would otherwise be required (e.g., one bit update circuit for each of the k block columns of macro matrix H).

In any event, router circuitry 58f forwards the most recent iteration of estimates $R^{i+1}_{mj}$ to the appropriate bit update circuits 60. Bit update circuits 60 accumulate these estimates $R^{i+1}_{mj}$ with the estimates for the same input node in the same column j, from different rows, as will now be described relative to FIG. 8, which illustrates the construction of one of bit update circuits 60 according to the preferred embodiment of the invention. The others of bit update circuits 60 within LDPC decoder 38 are contemplated to be similarly constructed.

Figure 8:
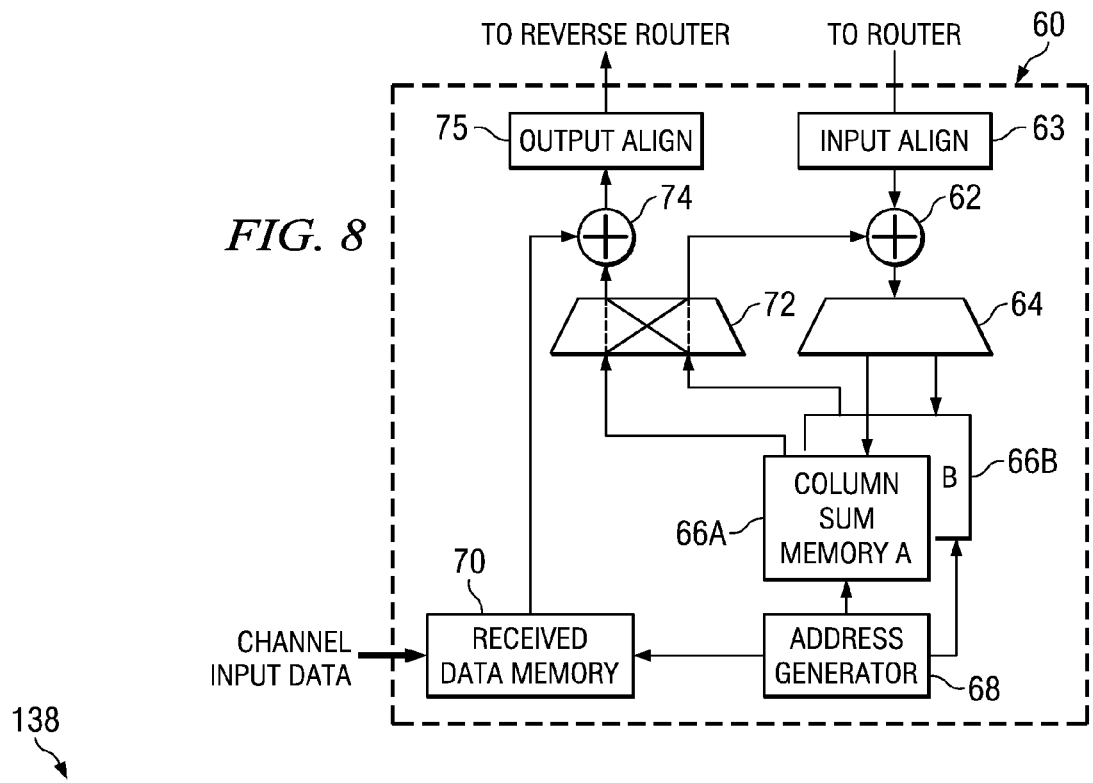
FIG. 8 is an electrical diagram, in block form, of a bit update circuit in the LDPC decoder of FIG. 5, according to the first preferred embodiment of the invention.

As shown in FIG. 8, bit update circuit 60 has a first adder 62 receiving an input from the router portion of router circuitry 58f via input aligner 63, and a second adder 74 that forwards its output to reverse router circuitry 58r via output aligner 75. Aligners 63, 75 are effectively shifters that can be used to align the incoming and outgoing data words as desired or necessary. Adder 62 has its output coupled to demultiplexer 64, which forwards the output of adder 62 to a selected one of column sum memories 66A, 66B. Address generator circuit 68 controls the addressing of column sum memories 66A, 66B, and received data memory 70. Received data memory 70 receives and stores channel input data, and applies this channel input data to an input of adder 74; the other input of adder 74 receives the output of a selected one of column sum memories 66A, 66B, via cross-switching multiplexer 72. The other output of cross-switching multiplexer 72 is applied to a second input of adder 72. Cross-switching multiplexer 72, in combination with demultiplexer 64, control the operation of column sum memories 66A, 66B to operate in a ping-pong buffer fashion relative to one another. One of column sum memories 66A, 66B is in an accumulation mode, by multiplexer 72 applying its output to adder 62 along with the adding its current value (via multiplexer 72) with the results from router circuitry 58, storing the result by multiplexer 64 connecting the output of adder 62 to the input of that accumulating one of column sum memories 66B, 66A. Meanwhile, cross-switching multiplexer 72 is forwarding the output of the other one of column sum memories 66A, 66B to an input of adder 74, to be summed with the contents of received data memory 70 and forwarded to reverse router circuitry 58r.

In operation, with reference to Equation (16), column sum memories 66A, 66B of bit update circuits 60 accumulate the sum of the estimated values $R_{mj}$ for its corresponding input node, which is associated with a corresponding one of the blocks of columns in the appropriate code. This accumulation is carried out by adder 62 receiving the most recent estimate $R^{i+1}_{mj}$ at one input, and receiving the current accumulation of estimates $R_{mj}$ for the same column j, but for different rows m, from one of column sum memories 66A, 66B, selected via cross-switching multiplexer 72. Adder 62 combines these values, and forwards the sum back to the selected column sum memory 66A, 66B, which rewrites the accumulated sum for that row and column position, expressed as the sum $$\sum_{m \in M(j)} R^{i+1}_{mj}$$

for iteration i+1, following Equation (16). This value is retained in the selected one of column sum memories 66A, 66B, at a memory location associated with the corresponding input node, as addressed by address generator circuit 68.

Address generator circuit 68 includes the appropriate logic and memory circuitry for maintaining and applying memory address values associated with the input nodes managed by bit update circuit 60. According to this preferred embodiment of the invention, each of the permutation matrices involved in generating parity check matrix $H_{pc}$ from macro matrix H are circularly shifted identity matrices, with the particular position of the identity diagonal varying with the position of the permutation matrix within macro matrix H. Because the rows within parity check matrix $H_{pc}$ are accessed in sequence and because the permutation matrices are sliding identity matrices, address generator circuit 68 can address column sum memories 66A, 66B also in a sequence, using relative addressing techniques. Preferably, address generator circuit 68 includes a register for storing an offset address value for the first column position within a particular block row of macro matrix H, with each successive row then having an address that is simply incremented from this offset value, with wraparound, modulo m. For example, if the first row (m=0) has a contribution from input node column position e, the next row (m=1) will have a contribution from column position e+1, and so on. Column sum memories 66A, 66B can thus store the accumulated values in a linear fashion, which greatly simplifies the construction of address generation circuit 68. Of course, the offset values will change when a new block row of macro matrix H is operated upon.

Alternatively, the permutation matrices within macro matrix H can be arranged differently than as circularly shifted identity matrices, so long as each permutation matrix only has a single column entry involved in each row. Address generation circuit 68 will, of course, have to comprehend the particular construction of these permutation matrices so that the memory locations in column sum memories 66 correspond to the proper column locations.

As mentioned above, the use of two column sum memories 66A, 66B, permits the updating of the accumulated estimates $$\sum_{m \in M(j)} R^{i+1}_{mj}$$

for one set of columns associated with one row of parity check matrix $H_{pc}$ while the accumulated estimates $$\sum_{m \in M(j)} R^{i}_{mj}$$

for the previous ($i^{th}$) iteration are forwarded back to parallel adder 54 for another set of columns associated with a different row of parity check matrix $H_{pc}$, for example the next successive row of parity check matrix $H_{pc}$ to be updated by parity check update circuitry 56. The architecture of LDPC decoder 38 according to this preferred embodiment of the invention thus provides a high degree of performance efficiency, by way of the pipelining effected by the ping-pong arrangement of column sum memories 66A, 66B. In addition, this arrangement greatly improves the utilization of the memory and logic resources of LDPC decoder 38, improving the efficiency with which it can be implemented.

This description will continue for the same row m and its associated columns that was updated in the prior discussion, and as such corresponds to some time in the future, after all updates have been completed for all rows in parity check matrix $H_{pc}$ in iteration i+1. Cross-switching multiplexer 72 forwards the new value of accumulated sums $$\sum_{m \in M(j)} R_{mj}^{i+1}$$

from the selected one of column sum memories 66 to adder 74. A second input to adder 74 receives the original received input node data value for that column, in the form of the ratio $$\frac{-2r_j}{\sigma^2},$$

the value $r_j$ being the received data value, as stored in received data memory 70. According to Equation (16), adder 74 therefore generates the current LLR value $L^{i+1}(q_j)$, corresponding to the current Log Likelihood Ratio probability for the corresponding input nodes, using the value $$\sum_{m \in M(j)} R_{mj}^{i+1}$$

for iteration i+1. This value is forwarded to the reverse router circuitry 58r, along with the values for the other corresponding columns that contribute to row m, to parallel adder 54, in the proper order for updating of the $R_{mj}$ estimates. Parallel adder 54 then generates updated $R_{mj}$ estimates as described above.

Because the corresponding updated column LLRs $L^{i+1}(q_j)$ are now available, it is convenient to use these values to evaluate this iteration i+1 to determine whether the decoding process has converged upon a valid result, satisfying the codeword equation Hc=0, GF(2). As such, the output word from reverse router circuitry 58r is also applied to parity check function 61, which performs the function of "hard slicing" the current LLR values $L(q_{mj})$ to digital bit values 0 and 1, and then exclusive-ORing these bits to determine whether a 0 result is returned for that row m. It is contemplated that the circuitry or program instructions (e.g., executable by baseband processor 39) for performing this determination can be readily derived by those skilled in the art, having reference to this specification. The results of function 61 are retained over all rows in macro matrix H, so that the ultimate termination decision can be made.

This iterative process then continues, until parity check function 61 determines that the current LLRs of the codeword input nodes match a valid decoding, by returning a "0" value when applied to all of the rows of parity check matrix $H_{pc}$, or until another termination criterion is met. According to the preferred embodiments of the invention, any validly decodable codeword c explicitly contains the payload data itself, i.e., the code is systematic. Baseband processor 39 or other circuitry in transceiver 20 then retrieves the payload data from the hard decision codeword, and the process is repeated for the next codeword or data block.

As noted above, this embodiment of the invention provides for excellent LDPC coding performance, with error rates approaching the Shannon limit, while still being readily and efficiently implementable in custom logic or in a sequence of program instructions. For example, several codes constructed in this manner have been investigated for their performance. For examples of rate ½ codes corresponding to FIG. 4a, bit error rate (BER) performance exceeding that of conventional LDPC codes of analogous size was obtained, resulting in BERs of on the order of $10^{-5}$ for Eb/No values of on the order of 1.2 to 1.4 dB, depending on the size of the prime m. Similarly, for rate ⅓ codes corresponding to the example of FIG. 4b, improved BER performance relative to conventional LDPC codes has also been observed, with BERs on the order of $10^{-5}$ attained at Eb/No values also on the order of 1.2 dB. In each case, the BER performance of these LDPC codes has been observed to approach that of conventional third generation (3G) cellular turbo codes, but with much more efficient implementation and performance.

According to a second preferred embodiment of the invention, this construction of the LDPC codes enables the use of parallel circuitry to greatly increase the performance of the LDPC decoding. More specifically, this parallelism is attained because the permutation matrices are constructed from a diagonal matrix (the identity matrix), so that incrementing of a row position within the permutation matrix means that the column position of the non-zero value also increments. The circularly (or "cyclically") shifted identity matrix is an example of permutation matrices with this property. The parallelism effectively performs the single row parity check update and column bit update steps in parallel for multiple rows within the same row block.

Figure 9:
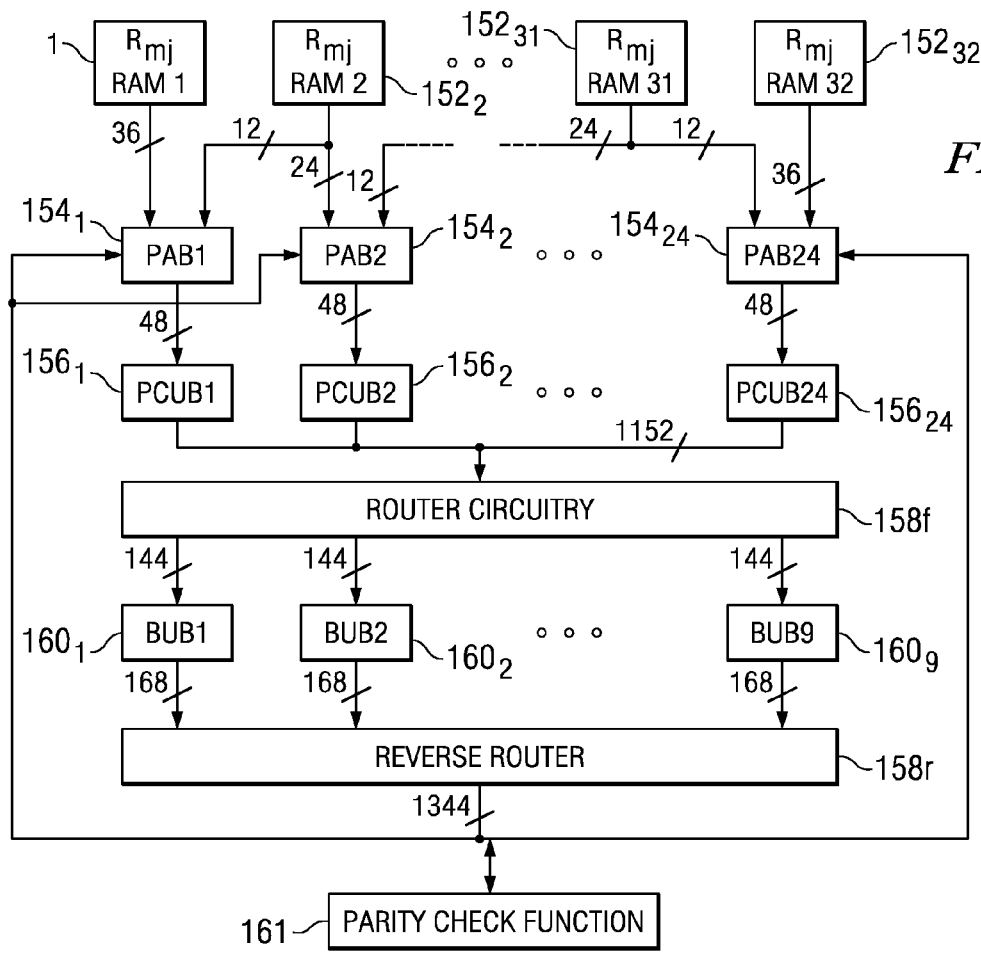
FIG. 9 is an electrical diagram, in block form, of an LDPC decoder according to a second preferred embodiment of the invention.

FIG. 9 illustrates LDPC decoder 138 according to this alternative parallel architecture, for the example of a rate ½ LPDC code, where macro matrix H has twelve block rows and twenty-four block columns, as in the case of FIG. 4a. The functional features of LDPC decoder 138 follow that of LPDC decoder 38 described above, but with multiple instances of those functions as required to effect the parallel operation.

According to this embodiment of the invention, multiple $R_{mj}$ memories 152 are provided. Each of memories 152 are dual port RAMs, and in this case have thirty-six output bits, and are thirty-two in number (RAMs $152_1$ through $152_{32}$). The number of RAMs 152 need not correspond to the number of rows of parity check matrix $H_{pc}$ that are being operated in parallel, but rather is preferably selected for convenience of the integrated circuit layout and manufacturing technology; indeed, the number of RAMs 152 is entirely arbitrary. In this example, twenty-four rows of parity check matrix $H_{pc}$ will be simultaneously processed, from thirty-two RAMs 152. Accordingly, the bit width of the output of each of RAMs 152 need not match that of the number of bits to be processed for a given row. In this example, each $R_{mj}$ estimate occupies six bits, and up to eight columns may contribute to a row of parity check matrix $H_{pc}$. As such, the thirty-six output bits from RAM $152_1$ and twelve output bits from RAM $152_2$ are applied to first parallel adder block $154_1$, while the remaining twenty-four output bits from RAM $152_2$ are applied to second parallel adder block $154_2$.

In this example, where twenty-four rows are processed in parallel, twenty-four instances of parallel adder blocks $154_1$ through $154_{24}$ are provided, each receiving eight possible $R_{mj}$ values from the corresponding R RAMs 152, along with a corresponding output of reverse router circuitry 158r corresponding to the LLR $L(q_j)$ as described above. Parallel adder blocks 154 are constructed similarly as described above relative to FIG. 5, and each produces the individual LLRs $L(q_{mj})$ from the difference of these two inputs, for its corresponding row of parity check matrix $H_{pc}$. These differences are presented to a corresponding one of twenty-four parity check update blocks $156_1$ through $156_{24}$, for execution of the hard decision function, and the updating of the next iteration of the estimate $R_{mj}$ for the columns in the operative row.

Parity check update blocks $156_1$ through $156_{24}$ are constructed similarly as described above relative to FIGS. 5 and 6, to perform the functions in the same manner as also described above. Each of parity check update blocks 156 operates independently from the others, because each is operating on a separate row of parity check matrix $H_{pc}$. The outputs of parity check update blocks 156 are applied to router circuitry 58f, and the updated estimates $R_{mj}$ are applied back to the corresponding ones of RAMs 152 (this connection not shown in FIG. 9), in the same manner as described above.

Router circuitry 158f routes the corresponding estimates $R_{mj}$ to the appropriate bit update unit within its corresponding bit update block $160_1$ through $160_9$. In this example, nine bit update blocks $160_1$ through $160_9$ are provided, for updating and maintaining the sums $$\sum_{m \in M(j)} R_{mj}$$

for the respective columns. According to this embodiment of the invention, all of the twenty-four rows being processed in parallel are from the same block row of macro matrix H, and as such the routing for all of the rows is identical. As such, the output value $R_{mj}$ for corresponding bit update positions from each of parity check update blocks $156_1$ through $156_{24}$ are all routed to the same bit update block $161_1$. For example, the first one of the outputs of each of parity check update blocks $156_1$ through $156_{24}$ may be routed by router circuitry 158f to first bit update block $160_1$, the second one of the outputs of each of parity check update blocks $156_1$ through $156_{24}$ may be routed to second bit update block $160_2$, and so on. The number of bit update blocks 160 (nine in this instance) is typically larger than the number of possible outputs from parity check update blocks 156, and corresponds to the number of block column groups of macro matrix H. The number of bit update blocks 160 is preferably not much larger than the number of outputs from parity check update blocks 156, however, so that router circuitry 158f can be relatively simple and efficient. This efficiency is a result of the construction of the LDPC code, according to the preferred embodiments of the invention, in which the order of terms, for example from left to right, in the outputs of any parity check update block 156 remains fixed after routing to bit update blocks 160.

Each of bit update blocks 160 is constructed and operates similarly as described above relative to FIG. 8, with the exception that twenty-four bit updates are being performed in parallel. The output of bit update blocks 160, corresponding to the $L(q_i)$ values as described above, are then re-routed back to parity adder blocks $154_1$ through $154_{24}$ for those columns, by reverse router circuitry 158r. In this example, the twenty-four output values output by bit update block $160_1$ are routed, one each, to corresponding ones of the twenty-four parallel adder blocks 154, and so on. In addition, reverse router circuitry 158r forwards these values to parity check function 161, which performs the hard slicing and parity check sum evaluation processes to determine whether the parity check equations expressed by parity check matrix $H_{pc}$ have been satisfied, in which case the belief propagation decoding for the current input nodes can be terminated.

In the example where circularly shifted identity matrices are used in macro matrix H as described above, the memory address offset e of the first column contributing to the first row of a block row will vary from permutation matrix to permutation matrix. These changes in the address offset e must of course be considered in this embodiment of the invention, as it is in the single row case described above. However, the parallelism of this embodiment of the invention provides an additional complexity that must be comprehended by the address generator circuitry within each of bit update blocks 160, as will now be described.

Figure 10:
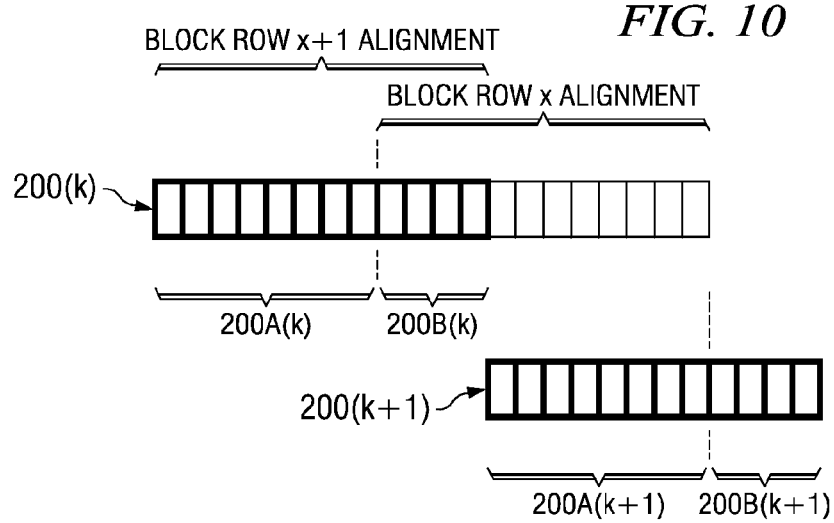
FIG. 10 is a timing diagram, illustrating data word misalignment according to the second embodiment of the invention.

While the offsets e associated with each of the non-zero entries in macro matrix H will vary, the number of rows being processed in parallel is constant, namely twenty-four in this example. Because the offset e does not necessarily vary according to the parallelism multiple (e.g., twenty-four), the same input node column will likely appear in a different position from one non-zero permutation matrix entry to the next. This situation is illustrated in FIG. 10, with reference to data words 200 that have been routed to one of bit update blocks 160 by router circuitry 158f. In FIG. 10, data word 200(k) represents a parallel data word received from router circuitry 158f, in the second embodiment of the invention described above relative to FIG. 9. In this example, data word 200(k) includes twelve entries, and represents the $R_{mj}$ estimates for twelve rows and twelve columns within a single block row, as described above.

However, considering the construction of the permutation matrices within macro matrix H, the column offset e for the column input node associated with the first row of a second successive block row (x+1 in FIG. 10) will likely not be at a multiple of twelve from that of a prior block row (x). This circumstance is illustrated in FIG. 10, where the alignment of data word 200(k) for block row x+1 does not align with the alignment for block row x.

The belief propagation algorithm requires the summing of the $R_{mj}$ estimates for the same column nodes, though. Because the multiple parallel sums are being operated on simultaneously by bit update blocks 160, the sums $$\sum_{m \in M(j)} R_{mj}$$

for a column node j that is updated in different block rows will thus not align, and thus will not be readily summable by bit update blocks 160. Accordingly, the address generator circuit must contemplate this mispositioning of the columns within the parallel group. From the viewpoint of memory addressing, this problem amounts to a misalignment of the data words corresponding to the column-based values. Other hardware must also comprehend this non-alignment. An example of such hardware includes input aligner 63 and output aligner 75 as shown in FIG. 8 for bit update blocks 60, each of which can shift the input and output data as appropriate, and also includes temporary store registers used in such alignment and shifting.

Figure 11:
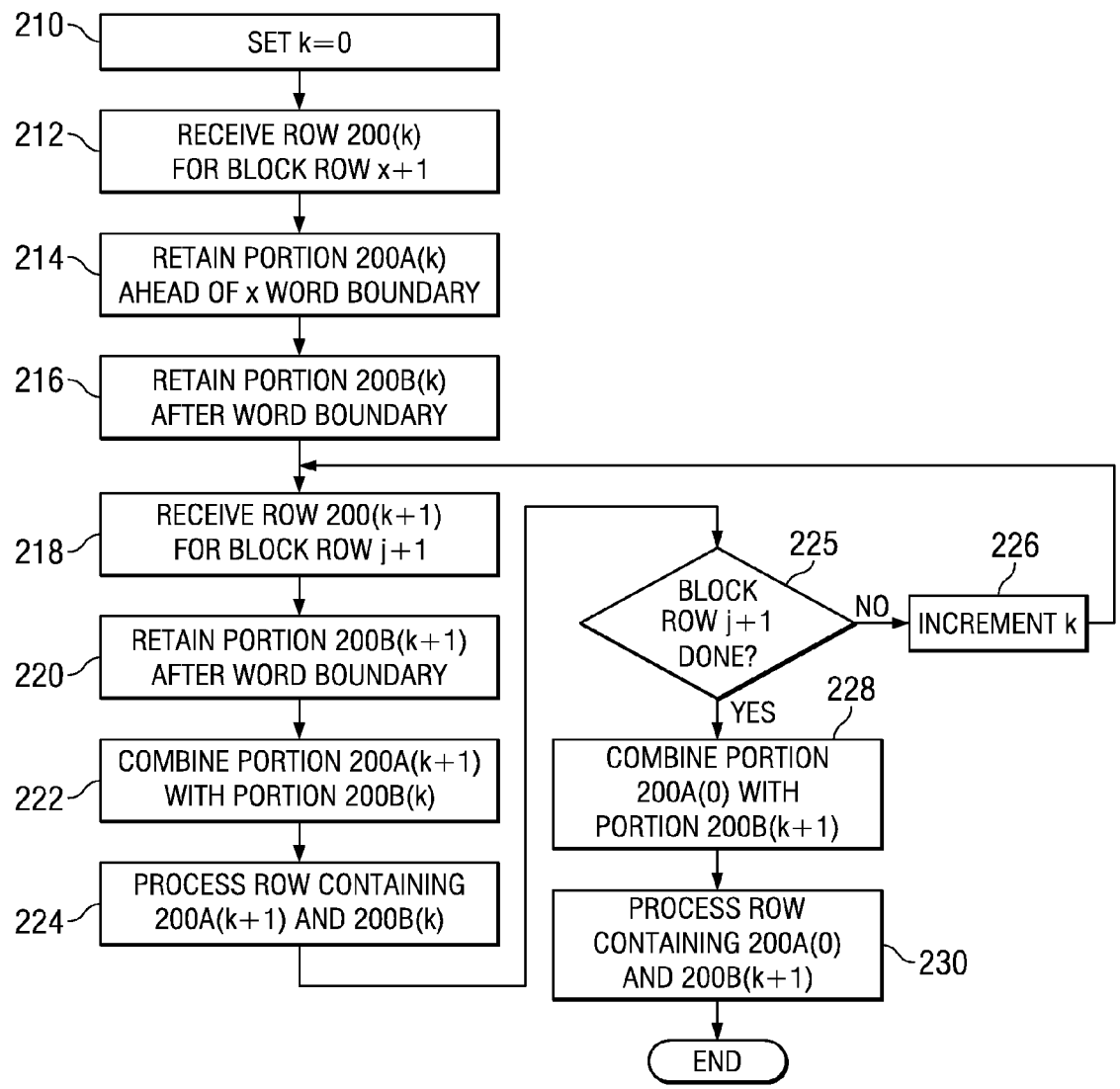
FIG. 11 is a flow chart illustrating a method for solving data word misalignment according to the second embodiment of the invention.

Referring now to FIG. 11 in combination with FIG. 10, the operation of bit update blocks 160 in managing the data word alignment to address this issue, according to this embodiment of the invention, will now be described. In process 210, row index k is initialized to zero. This is followed by process 212, in which data word 200(k) (which, at this point, k=0) is received, for multiple rows within block row x+1. As shown in FIG. 10, this data word 200(0) is misaligned, because its offset address e differs from that of block row x by eight positions. The alignment of the data word for block row x is shown in FIG. 10, by way of example. According to this embodiment of the invention, referring back to newly received data word 200(k), data word portion 200A(k) is that portion of data word 200(k) that is ahead of the prior word boundary for block row x, and data word portion 200B(k) is that portion of data word 200(k) that is after the prior word boundary for block row x. Of course, all of bit update blocks 160 have received similar data words 200(k), and will operate in similar fashion as described relative to FIGS. 10 and 11.

In process 214, bit update block 160 retains data word portion 200A(0) in a local register or store; as mentioned above, this portion 200A(0) is that portion of data word 200(0) that is ahead of the word boundary for block row x. In process 216, bit update block 160 retains data word portion 200B(0) in a separate (or separately accessible) local register or store; also as mentioned above, this portion 200B(0) is that portion of data word 200(0) that follows the block row x word boundary.

In process 218, next data word 200(k+1) is then received, which, at this point, is data word 200(1) because index k=0. Data word 200(k+1) is illustrated in FIG. 10, by way of example, illustrating its relative alignment to data word 200(k). Data word portion 200B(1), following the data word boundary from block row x, is retained in a local store or register in bit update block 160, in process 220.

According to this embodiment of the invention, in process 222, data word portion 200A(1) is combined with data word portion 200B(0) that was retained in process 216. This combined data word 200B(0):200A(1) constitutes an aligned data word, and is aligned with the same data word alignment as that of block row x. Because, according to this embodiment of the invention, all block rows are similarly processed, this results in all data word alignments among all of the block rows being coaligned. As such, the same column input node will have a consistent data word position, over segments of rows within the block row of macro matrix H in which it participates. In process 224, this combined data word is then processed, and its contributions to the various column input nodes summed, as described above relative to FIG. 8, for each data value within the combined data word.

In decision 225, LDPC decoder 138 determines whether additional rows remain within the current block row (x+1) remain to be processed. If so (decision 225 is NO), index k is incremented in process 226, and processes 218 et seq. are repeated for the next row. If the current block row is complete (decision 225 is YES), then only the initial leading data word portion 200A(0) and the most recent trailing data word portion 200B(k) remain to be processed. These two data word portions are combined into data word 200A(0):200B(k+1) in process 228, and is processed for update of the column input nodes, in similar manner as described above, in process 230.

Similar management of the misaligned data words must also be performed in handling data words as they are being output by bit update circuits 160, following the same concept as that described above for the incoming data words. It is contemplated that those skilled in the art having reference to this specification will be readily able to effectively reverse the process for the outputting of results from bit update circuits 160.

In addition, another source of misalignment is also present within each permutation matrix. As discussed above, the permutation matrices are square matrices, of dimension p by p. Because p is prime, however, the parallelism factor will necessarily not evenly divide into the number of rows of the permutation matrix. This means that a partial data word will necessarily result at some point within the processing of a block row; this partial data word may occur at any point within the block row, or permutation matrix. Preferably, the overall architecture of LDPC decoder 38 is constructed and controlled to efficiently deal with these occasional partial words. It is contemplated that those skilled in the art having reference to this specification will be readily able to manage these partial word events.

Referring back to FIG. 9, while the routing and reverse routing circuitry 158f, 158r, are somewhat more complex than in the single case, the decoding throughput is greatly increased by the parallelism provided by this second embodiment of the invention, by a factor corresponding to the number of parity check update blocks 156. The ability to properly align the multiple data words is also provided, maintaining simplicity and fidelity of the bit update steps in the belief propagation method. It is contemplated that the resulting parallelism renders the present invention especially useful in high data rate applications.

According to further alternative embodiments of the invention, additional flexibility and memory space efficiency can be provided by arranging memory 52, 152 in multiple blocks. The efficiency of the memory implementations is somewhat complicated by the irregular nature of macro matrix H, considering that the weights, or degree, of the parity check rows varies from row to row; in other words, the number of columns in each row that participate in the parity check equation varies from block row to block row. In the example of FIG. 4a, the row degree varies between 7 and 8; for the example of FIG. 4b, the row degree varies between 5 and 6. Other codes may provide even a greater variation in row degree. This variation makes the memory implementation somewhat more complicated than for regular codes.

According to many variations of the preferred embodiments of the invention, however, the variations in row degree can be readily incorporated into the implementation and access of memories 52, 152. Specifically, the following description will refer to alternative implementations of memory 52 as used for the single row-at-a-time operation described above relative to FIGS. 5 through 8. However, it is contemplated that those skilled in the art having reference to this specification will be readily able to implement similar arrangements in connection with multiple row processing, as described above relative to FIGS. 9 through 11.

According to one alternative implementation, memory 52 may be simply sized to correspond to the largest possible degree, times the number of bits used to store each $R_{mj}$ value. For example, if the largest row degree to be contemplated is nine, and if six bits are used for each value, the width of memory 52 may be set to fifty-four bits. For those rows that have fewer than nine values, the remaining entries in the particular memory word in memory 52 may be filled with the next row's values. This approach may be generalized so that the data values for a first row of a block row of macro matrix H may be stored in a row in memory 52; the remainder of that row of memory 52 may be used to at least partially store data values for the next row of the block row of macro matrix H, and the remainder of the data values in that next row of the block row of macro matrix H are stored from the beginning of the next row in memory 52. It is contemplated that the memory access control of the row values stored in memory 52 according to these alternatives can be effected by an arrangement of multiplexers and registers, as will be apparent to those skilled in the art having reference to this specification. Indeed, if the values for each row of macro matrix H fits, on the average, within a single row of memory 52, it is contemplated that this improved packing may be implemented without involving extra memory cycles to be used in operation.

Further in the alternative, memory 52 may be sized to correspond to typical row degrees, but with the understanding that some rows of macro matrix H may have an extra term that does not fit within a single row of memory 52. According to this additional alternative, an auxiliary memory may be provided to store the additional value or values for those rows of macro matrix H. This alternative approach may be particularly beneficial to provide code flexibility in LDPC decoder 38, where memory 52 is sized to handle most code sizes but where the flexibility to handle some codes that involve large row degrees for some rows in macro matrix H is desired.

Figure 12:
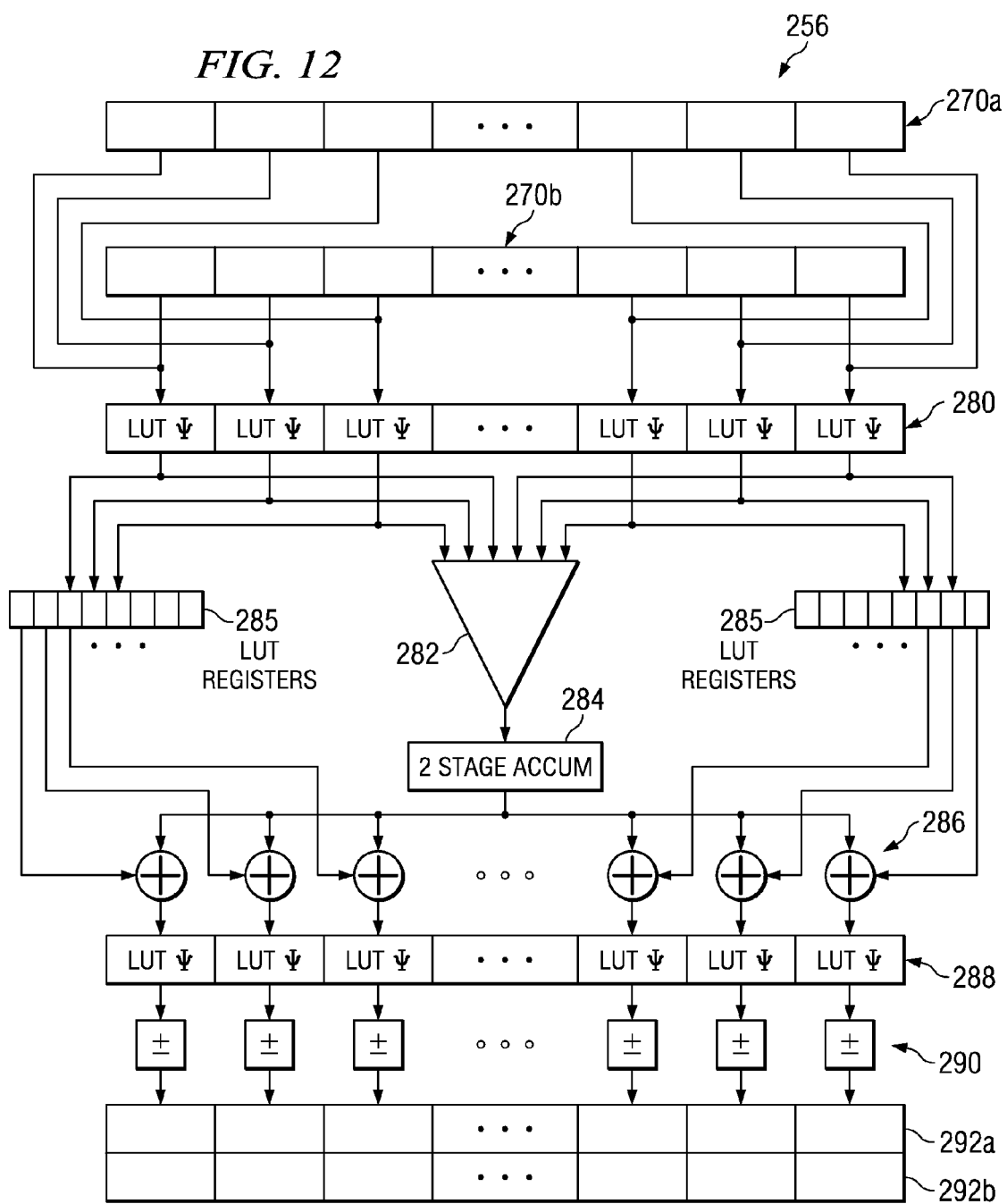
FIGS. 12 and 12a are electrical diagrams, in block form, of the construction of a parity check and update circuit according to an alternative embodiment of the invention.

An important benefit of this invention is its flexibility in applying the LDPC decoding circuitry to a variety of code sizes. In general, two different approaches may be followed in order to handle a code in which the maximum row size (i.e., number of non-zero entries in a given row of parity check matrix $H_{pc}$) is greatly increased. In one approach, the operation of the decoding circuitry is time-sequenced to handle the double-sized rows in two cycles. In another approach, portions of the decoding circuitry are doubled and their results handled in parallel, permitting each row to be handled in a single cycle. According to the time-sequencing, or time doubling, approach, the construction and operation of an example of parity check update circuitry 256 will now be described relative to FIG. 12. As in the prior case, the input word is received from a parallel adder block, but for a single row that resides in two separate data words, the input word is necessarily processed in two cycles. As shown in FIG. 12, two input registers 270a, 270b are provided, for receiving a single input word for a row of parity check matrix $H_{pc}$ and separating it into two input words. These two words are forwarded sequentially through look up tables 280, and adder tree 282. Alternatively, the feeding of input words may be pipelined and sequentially applied to a single instance of input registers 270.

Figure 12A:
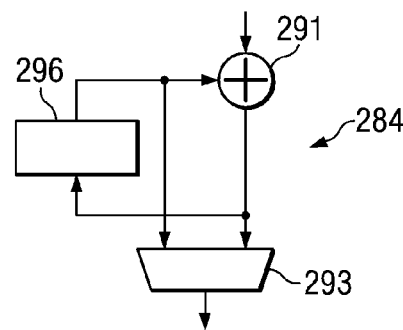

At the output of adder tree 282, two-stage accumulator 284 accumulates the sequential partial sums through LUTs 280 and adder tree 282 into a full sum for the matrix row. The construction of two-stage accumulator 284 is illustrated in further detail in FIG. 12a. The output of adder tree 282 is applied to adder 291, which receives the output of register 296 at another input. Multiplexer 293 receives the output of adder 291 at one input, and the output of register 296 at another input, and its output is applied to subtracting adders 286. In operation, in the first of the two cycles for a given row, the first value is passed through adder 291 (register 296 being cleared after the prior operation, or its contribution to adder 291 being ignored for this first cycle), and is stored in register 296. In the second of the two cycles for that row, the incoming second value is added to the first value (from register 296), and multiplexer 293 applies the full sum, for both portions of the row, from the output of adder 291 to subtracting adders 286. This sum is also stored in register 296, and is applied to subtracting adders 286 in the next cycle, for use in a second subtraction. In this way, adder tree 282 and two-stage accumulator 284 serve to generate the full sum, over the entire row of parity check matrix $H_{pc}$, even though two passes through adder tree 282 is required.

Subtracting adders 286 receive sequential inputs from LUTs 280 to generate each subtracted value that is applied in the two input data words. As noted above, the full sum is generated over two successive cycles by adder tree 282 and two-stage accumulator 284. Two sets of LUT 280 results are used for sequential subtractions, and as such LUT output registers 285 are provided to store the LUT outputs in sequence. Two output registers 292a, 292b are optionally provided to store the two portions of the output result, for forwarding in parallel to corresponding inputs of the bit update circuitry 60, 160 with registers 292a, 292b being logically in parallel with one another. Alternatively, the sequential outputs can be sequentially forwarded in two separate portions, in which the column input nodes are updated in separate cycles.

As a result, in this embodiment of the invention in which a single parity check update block 256 operates over two passes, the data path is made effectively wider, and capable of handling a wider set of values from the parallel adder block. This permits a great deal of flexibility in handling a wide range of code rates with the same LDPC circuitry, thus permitting programmability in the encoding and decoding processes.

Figure 13:
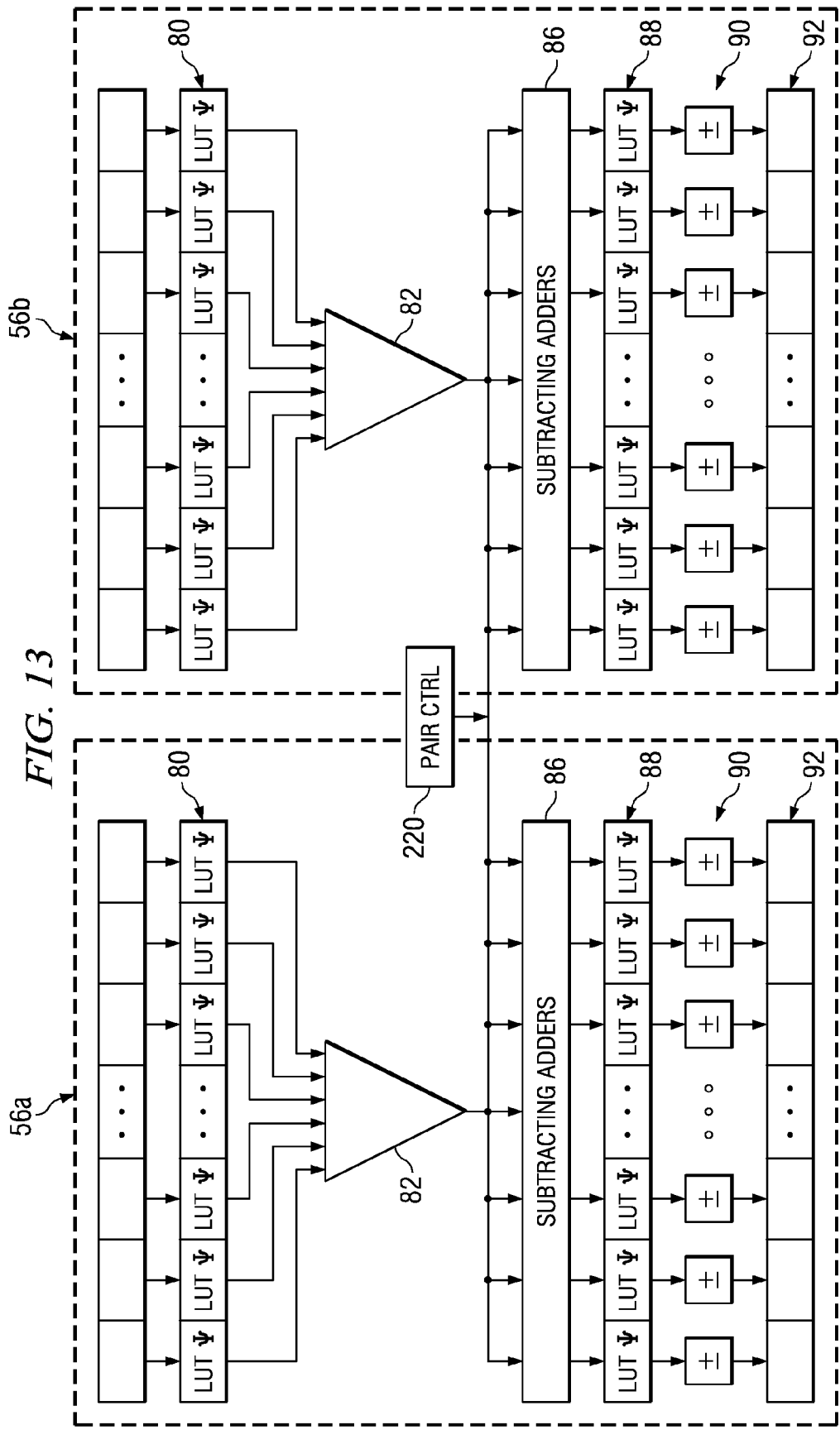
FIG. 13 is an electrical diagram, in block form, of the construction of a parallel parity check and update circuit according to another alternative embodiment of the invention.

Referring now to FIG. 13, the construction of the parity check update function according to an alternative implementation will now be described. In this embodiment of the invention, multiple parity check update functions 56, in parallel, have their outputs selectively connected together to produce a full sum. This parallel connection permits wider matrix rows, wider than the width of a single parity check update function 56, to be split across multiple datapaths and handled in a single cycle.

In the example of FIG. 13, parallel parity check update functions 56a, 56b are provided. The construction of the individual parity check update functions 56a, 56b is the same as described above relative to FIG. 6, and will not be repeated here. According to this alternative implementation, pair control circuit 220 is provided to selectably bus the outputs of augmented adder trees 82 to one another, so that the outputs of the individual adder trees 82 create a full sum from both adder trees as though the individual adder trees 82 were a single adder tree. This total sum is presented to each of the subtracting adders 86 in each of parity check update functions 56a, 56b, so that the total sum used by each subtracting adder 86 includes not only the contributions to the sum from the augmented adder tree 82 in its own parity check update function 56, but also the contributions to this sum from the augmented adder tree 82 in its paired parity check update function 56.

Of course, more than two such parity check update functions 56 could be used in parallel to handle a single ultrawide row, if desired. For example four parity check update functions 56 could be grouped in this manner, thus providing a ×4 parallel capability. In such an arrangement, it is contemplated that the corresponding control circuitry could selectably process four shorter rows at once (one from each parity check update unit), one ultrawide row by combining the sum from all four parity check update units, or a by-2 operation in which the parity check update units are paired, with each pair handling a wide row of up to 2× width. It is contemplated that the detailed construction and control of these and other alternative implementations will be apparent to those skilled in the art having reference to this specification.

As mentioned above, an important benefit of this invention is its great flexibility in applying the LDPC decoding circuitry to a variety of code sizes, either by time-sequencing or by the simultaneous use of multiple portions of the decoding circuitry. In the context of parallel construction such as shown in FIG. 9, the time-sequencing approach holds the parallelism factor Z constant, so that the circuitry operates on the same number of rows in parallel, but the circuitry is time-sequenced to handle double-sized rows in two cycles. In the other approach, the parallelism factor Z is reduced (e.g., cut in half), so that each longer row is handled in a single cycle.

For the time sequencing approach, referring back to FIG. 9, row memories 152 will supply Z partial rows with each of two successively paired words (which together are the Z full rows). In this example, parity check update blocks 156 will operate in a sequential fashion, as described above relative to FIGS. 12 and 12a, to process a full row of data over two cycles, and supply bit update blocks 160 with the correctly computed outputs, also over two cycles.

In this time sequencing approach, there may not be enough bit update blocks 160 to handle a full row, but it is contemplated that there will be at least half of the required number. Considering that each separate data item from parity check update blocks 156 originate from a different column grouping, and that each such item will likely be routed to a different bit update block 160, bit update blocks 160 will also be time sequenced in this approach. More specifically, in the first of the two paired cycles, router circuitry 158f will route the first set of partial row outputs from parity check update blocks 156 to their correct bit update units 160, and in the second of the two cycles, router circuitry 158f will route the second set of partial row outputs from parity check update blocks 156 to their correct bit update units 160, which are likely to differ from those for the first set of partial row outputs. In turn, bit update units 160 will be operating on entries from one non-zero submatrix of macro matrix H in one cycle, and another non-zero submatrix in the next. In order for bit update units 160 to toggle in this fashion, it is contemplated that some circuitry, such as control circuitry and data registers, may be duplicated in bit update units 160.

The construction and operation of the output paths of bit update unites 160 will similarly be constructed and operate, to effect time sequencing on the outputs passing through reverse router circuitry 158r.

According to the other approach, in which the parallelism factor Z is reduced, consider an increase in the code size (row size) by a factor of two. The new parallelism factor Z' then becomes Z/2. In each cycle, Z' full rows will be processed in a cycle. According to this embodiment of the invention, neighboring parity check update blocks 156 are paired and combined as described above relative to FIG. 13, thus providing a larger effective parity check update block 156.

In this approach, it is contemplated that the number of bit update blocks 160 are also less than that required by the wider row. As such, bit update blocks 160 are again time sequenced, similarly as described immediately above for the time-sequenced operation. In this approach, bit update blocks 160 must additionally have sufficient storage to be able to combine data across cycles to process the data with a higher parallelism factor (Z=2Z'), to match the data flow rate with the computation rate.

More specifically, partial data from each of two submatrices A, B are stored by bit update blocks 160 in a first cycle. In the next cycle, the remaining data for submatrix B are stored and the remaining data for submatrix A are grouped with the partial data for submatrix A from the previous cycle, so that this combined data appears as data having the full parallelism factor (Z=2Z'). In the next cycle, the two stored data items for submatrix B are combined and similarly processed by bit update blocks 160; in addition, because this cycle is the first cycle in the next cycle pair, the next row's first partial data for two submatrices A, B are stored. This pipelined-like process continues to match the full row data rate.

Again, the output side of bit update blocks 160 are similarly constructed to correspond to the computation rate.

According to these two approaches, therefore, the LDPC decoding circuitry is capable of handling a wide range of code widths. While the described examples handle increased widths up to double the size of one another, it is contemplated that this concept can be readily extended in a similar manner to greater multiples, by those skilled in the art having reference to this specification. The configuration and operation of the LDPC decoding circuitry to accomplish this change in code size is contemplated to be under software control, thus providing transceivers having a wide range of field flexibility.

Referring now to FIGS. 14a through 14g, alternative arrangements of memory 52 to provide even more flexibility in connection with this invention will now be described. According to these alternative arrangements, it is contemplated that memory 52 (and memory 152 in the parallel case) is implemented by multiple memory blocks. Addressing and input/output multiplexing circuitry is provided to logically arrange the memory blocks in an optimal fashion for the particular code. In this manner, the LDPC decoding circuitry according to this invention is contemplated to be widely applicable over a large set of codes, providing efficiency and excellent performance in each.

In the examples of FIGS. 14a through 14f, memory 252 is arranged in four blocks 252a through 252d. For this purpose, it is contemplated that each block 252 has a width of q data values (which each may be six or seven bits in width), and a length (i.e., depth) of s rows, corresponding to rows in parity check matrix $H_{pc}$. Routing circuitry is selectively enabled, for example under software control or in response to the state of a control register, to logically arrange the memory blocks in the manner shown in these Figures.

It is contemplated, relative to the examples illustrated in FIGS. 14a through 14f, that the physical arrangement of memory blocks 252a through 252d may not physically resemble any one of these arrangements in the physical sense. In addition, each of memory blocks 252a through 252d may include multiple physical memory arrays, as convenient for the physical layout. Rather, the arrangements of FIGS. 14a through 14f represent the logical arrangement of these blocks, as effectively used by LDPC decoders according to this invention. FIG. 14g illustrates an example of a physical circuit arrangement of memory blocks 252a through 252d, in which logical routing circuitry 259 is illustrated as connected between memory blocks 252a through 252d, and a memory bus MEMBUS. Logical routing circuitry 259 is constructed so as to logically arrange the inputs and outputs of memory blocks 252a through 252d in a selectable manner, examples of which are illustrated in FIGS. 14a through 14f. It is contemplated that logical routing circuitry 259 may be constructed by way of various multiplexers and demultiplexers, or alternatively by way of a shift register arrangement by way of which the inputs and outputs of one or more of memory blocks 252a through 252d can be selectably sequenced to memory bus MEMBUS. It is contemplated that those skilled in the art having reference to this specification will be readily able to construct the appropriate implementation of logical routing circuitry 259.

Figure 14A:
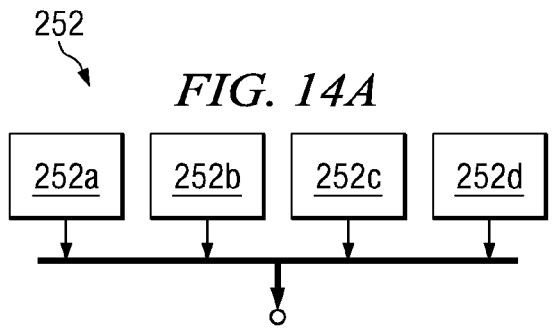
FIGS. 14a through 14g are electrical diagrams, in block form, of various alternative logical arrangements of memory according to the preferred embodiments of the invention and the physical circuitry for effecting these logical arrangements.

In FIG. 14a, blocks 252a, 252b, 252c, 252d are arranged in a simple maximum width mode, with no multiplexing among the four blocks 252a through 252d. In this example, the width of memory 252 is 4q, while the length of memory 252 is s, thus permitting the use of memory 252 for s rows of parity check matrix $H_{pc}$. As evident from this description, both the input to and output from memory blocks 252a through 252d will be arranged in this fashion.

Figure 14B:
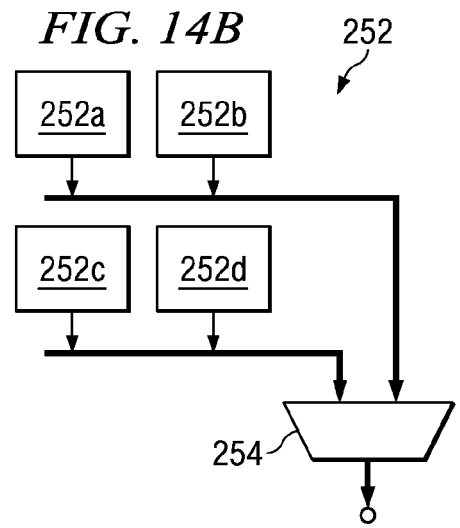

FIG. 14b illustrates a simple multiplexed arrangement. In this arrangement, blocks 252a, 252b are paired, and their outputs applied to one input of multiplexer 254; similarly, blocks 252c, 252d are paired, and have their outputs applied to the other input of multiplexer 254, which is part of logical routing circuitry 259. The inputs to memory blocks 252a through 252d are similarly arranged (but not shown in FIG. 14b for the sake of clarity). The width of memory 252 in the logical arrangement of FIG. 14b is 2q, while the length is 2s.

Figure 14C:
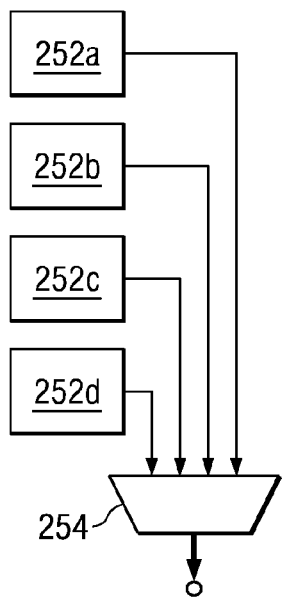

FIG. 14c illustrates a logical arrangement of memory blocks 252a through 252d that is the converse of that of FIG. 14a. In FIG. 14c, each of blocks 252a, 252b, 252c, 252d have their outputs coupled to respective inputs of multiplexer 254. As such, only one of memory blocks 252a through 252d are accessed at a time. This results in a width, for memory 252, of q values, and a length of 4s rows. Similarly, the inputs to memory blocks 252a through 252d are similarly arranged. Again, it is contemplated that the physical implementation of the logical arrangement of memory blocks 252a through 252d can be accomplished by way of logical routing circuitry 259 of FIG. 14g.

Figure 14D:
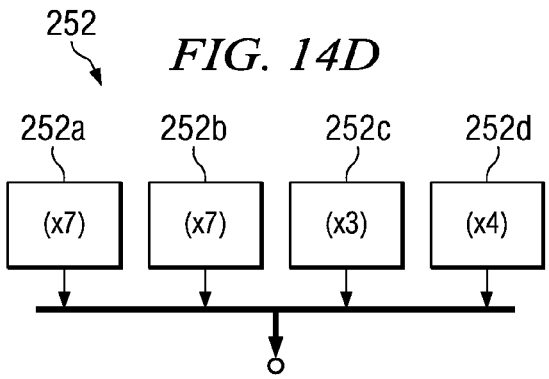
Figure 14F:
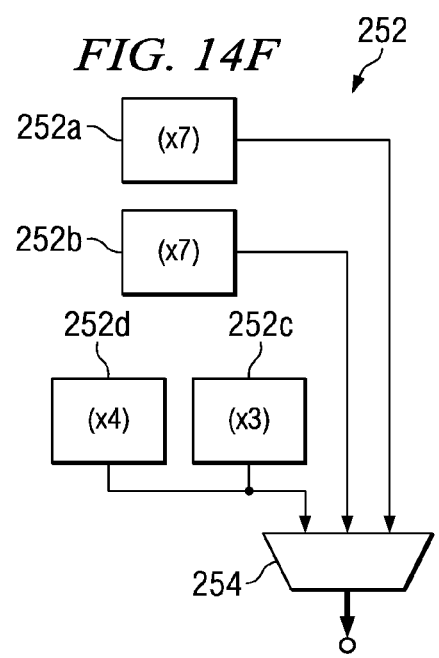

Also according to this embodiment of the invention, the data widths of blocks 252a through 252d need not be uniform among one another. FIG. 14d illustrates a simple maximum width arrangement of blocks 252a, 252b (each with a width of seven) and blocks 252c, 252d, with widths of three and four, respectively. In this arrangement, similarly as FIG. 14a, a maximum width (q=21) is provided, with minimum length (s rows).

Figure 14E:
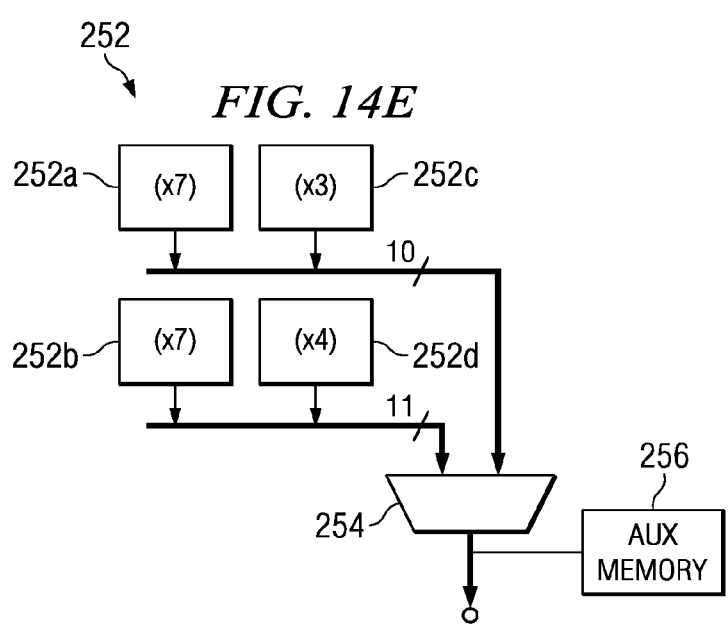
Figure 14G:
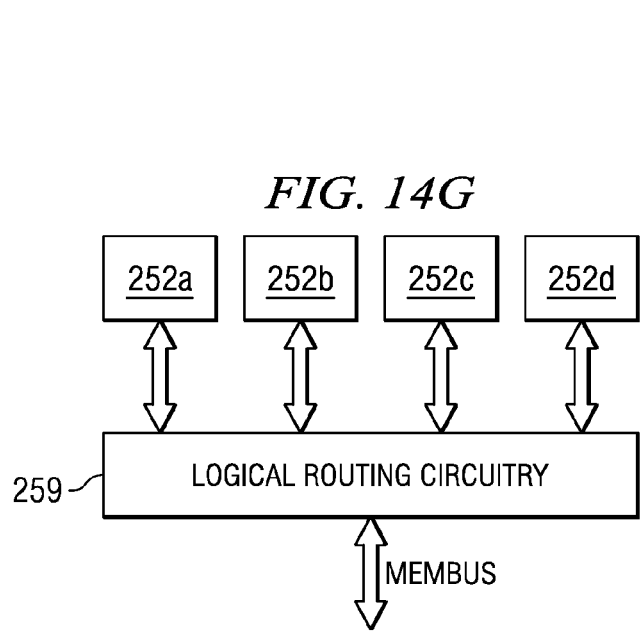

FIG. 14e illustrates another arrangement of memory 252, in which many of the rows are of one of two degrees (e.g., ten and eleven). Block 252a and block 252c are paired with one another, and their combined outputs of width ten are applied to an input of multiplexers 254. Blocks 252b, 252d are similarly paired, and their combined outputs (width of eleven) are applied to a second input of multiplexers 254. In this manner, multiplexers 256 applies either rows of ten or eleven elements to the downstream functionality. In addition, auxiliary memory 256 is also provided, for storing data elements for a relatively small number of rows that have a degree higher than eleven. The output of auxiliary memory 256 is combined with that of multiplexer 256, to provide additional width in the row degrees, thus providing additional flexibility in the implementation.

FIG. 14f illustrates an arrangement by way of which blocks 252a, 252b both have their outputs applied to inputs of multiplexer 254; blocks 252c, 252d are paired, and their combined outputs are applied to a third input of multiplexer 254. This resulting arrangement provides a data width of seven over all groups, and a common depth of s rows.

According to this set of alternative implementations, it is contemplated that a high degree of code flexibility is provided by this invention, in a manner that maximizes the efficiency of the memory utilization.

LDPC Encoding

As mentioned above relative to FIG. 1, LDPC encoder function 11 in the transmitting transceiver 10 is responsible for encoding the input datastream with the LDPC code corresponding to macro matrix H and parity check matrix $H_{pc}$, as decoded by LDPC decoder circuitry 38 in receiving transceiver 20 according to the various preferred embodiments of the invention. Once the particular LDPC code is designed and arranged, having the benefits of efficient implementation in the decoder as described above, it is contemplated that those skilled in the art having reference to this specification will be readily able to implement the corresponding encoding into the transmitting transceiver 10, by way of conventional approaches. However, for purposes of clarity and completeness of this specification, the preferred encoding approaches will now be described.

As known in the art, LDPC codes do not immediately result in simple and efficient encoding methods, particularly for real world computation and hardware implementation. Structured approaches to encoder construction may or may not be available, considering that the parity check matrices according to this invention are intended to provide desirable performance characteristics on the decoding side. In general, therefore, one can consider the encoding process to be based on matrix multiplication of the an input vector x (having K information bits) with a generator matrix G to produce the codeword c:

$$c = G^T x \qquad (19)$$

As such, a straightforward encoding process derives generator matrix G for a given macro matrix H and corresponding parity check matrix $H_{pc}$, and performs the above matrix multiplication. In general, though, this requires NK multiplications (N being the number of bit nodes of codeword c), and nearly that many additions, for the encoding of a single codeword. Efficiencies in that regard are known, and will be mentioned below.

A preferred approach to the derivation of generator matrix G from a known parity check matrix will now be described. It is known in the art that:

$$H_{pc} \cdot G^T = 0 \qquad (20)$$

By placing matrices G, $H_{pc}$ in systematic form, the derivation of one from the other is simple. For systematic matrices $G^T_{sys}$ and $H_{sys}$:

$$H_{sys} G^T_{sys} = [P \mid I_m] \begin{bmatrix} I_K \\ P \end{bmatrix} = PI_K + I_M P = 0 \qquad (21)$$

where the $I_z$ matrices are identity matrices of dimension z. Conversion of parity check matrix $H_{pc}$ into its systematic form is quite straightforward, especially using the MATLAB computing environment available from The Mathworks, Inc., by adding (modulo 2) a copy of any row to another row, and by swapping any two columns; neither operation changes the code or rank of the matrix. A simple modification of the row reduction function of MATLAB can also be used to form an identity matrix at the front of parity check matrix, by using row additions until the process is finished or a zero pivot is reached. If a zero pivot is found, column swaps are performed on the remaining matrix to locate a non-zero pivot. These operations result in the derivation of matrix P.

Once matrix P is derived, then generator matrix G can be readily produced using equation (21). The partitioning of systematic generator matrix $G_{sys}$ that is apparent in equation (21) also defines a partitioning in codeword c that is generated from $c = G^T_{sys} x$, i.e., the first K bits are the K information bits. Also, because of the column swapping that is done in the reducing of parity check matrix $H_{pc}$, the order of the codeword bits is not correct for the original parity check matrix $H_{pc}$. Because LDPC decoding circuitry 38 is based on this original form of parity check matrix $H_{pc}$, the order of bits in codeword c must be reordered according to the order in systematic matrix $H_{sys}$. Alternatively, this could be accomplished by reordering the rows of systematic generator matrix $G_{sys}$.

In some cases, the result of the row reduction will cause parity check matrix $H_{pc}$ to not be of full row rank, as including some number of dependent rows. The systematic matrix $H_{sys}$ will simply have all zeros in its bottom rows after the reduction process. This will result in new code size parameters with a larger effective K and a smaller effective M (their sum still equaling N). Generator matrix $G_{sys}$ will still be a valid generator matrix, although it will be encoding fewer information bits (and the true code rate will be slightly increased); parity check matrix $H_{pc}$ will still be a valid parity check matrix, and used for decoding.

In practice, the derivation of generator matrix $G_{sys}$ need only be done once per code, and as such this generation does not enter into the real-time encoding flow. However, as mentioned above, the actual encoding of payload data can be quite complex, if performed by way of a straightforward matrix multiplication of the datastream by generator matrix $G_{sys}$. This is due in part to systematic generator matrix $G_{sys}$ being typically quite dense, even though parity check matrix $H_{pc}$ is quite sparse. Therefore, while this approach will properly generate the desired codewords, it is contemplated, in connection with this invention, that some amount of efficiency can be implemented in this encoding.

One approach follows that described in T. J. Richardson and R. L. Urbanke, "Efficient Encoding of Low-Density Parity-Check Codes", *IEEE Trans. on Information Theory*, Vol. 47, No. 2 (February 2001), pp. 638-656, incorporated herein by this reference. In this approach, in its construction, and by way of row and column reorderings, parity check matrix $H_{pc}$ is arranged to be lower triangular over the upper $M_r \times M$ portion that will multiply against the parity bits in the codeword. Because $M_r < M$, this lower triangular property will end prior to the last few check equations or rows. The parity bits can then be recursively determined over the lower triangular portion, beginning with the first parity bit that is the only remaining unknown in the first parity equation in the first row of parity check matrix $H_{pc}$. Beginning with this first parity bit, the second parity bit in the second row can be similarly determined, and so on. Upon reaching the end of the lower triangular portion, while more parity bits remain to be derived, this lower portion of the parity check matrix is quite small, and can be inverted to solve the remaining parity bits. Of course, this technique requires the situation in which parity check matrix $H_{pc}$ can be arranged in this form.

Another approach is described in MacKay, et al., "Comparison of Constructions of Irregular Gallager Codes", *IEEE Trans. on Comm.*, Vol. 47, No. 10 (IEEE, 1999), pp. 1449-1454, incorporated herein by this reference. This approach extends the Richardson et al. concept described immediately above, by forming a different form of lower triangular parity check matrix $H_{pc}$. In this case, the parity bit portion of parity check matrix $H_{pc}$ is lower triangular only over the upper right $M_r \times M$ portion. While the recursion approach cannot be followed in this form, parity check matrix $H_{pc}$ can be viewed in terms of its major block matrices along natural divisions, from which sparse computations of matrix equations can be used to derive the encoding.

It is contemplated that those skilled in the art having reference to this specification will comprehend the general nature of the encoding process, especially considering these examples. It is also contemplated that those skilled artisans can implement the encoding functions either in terms of a general software implementation or, considering that the modulo 2 multiplications and additions can be trivially implemented in hardware by AND and XOR gates, in terms of custom logic hardware.

In Conclusion

According to all of the preferred embodiments of the invention, a hardware efficient LDPC coding and decoding method and circuitry is provided. The code involves a high degree of irregularity, thus providing excellent performance, nearing the Shannon limit in some cases. This performance is attained while enabling relatively simple and robust hardware implementation, despite the irregular codes.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A spread spectrum processor coupled to a program memory for storing a sequence of operating instructions, said spread spectrum processor comprising:
    a macro matrix defining a Low Density Parity Check (LDPC) code said macro matrix having zero-valued and non-zero-valued entries arranged in block rows and block columns and in which each zero-valued entry corresponds to a p×p zero-valued matrix and each non-zero-valued entry corresponds to a p×p permutation matrix that has at most a single "1" entry in each row and each column and "0" entries elsewhere to define a parity check matrix, wherein the block columns of the macro matrix are grouped into groups of block columns so that at most one column in any group has a "1" entry in any row, at least one of the groups including more than one block column, and wherein the columns of the parity check matrix correspond to input nodes and the rows of the parity check matrix correspond to parity check sums;
    local memory for code execution and data buffering;
    an embedded central processing unit (CPU) for executing said sequence of operating instructions to perform a plurality of operations comprising:
        receiving a set of input values corresponding to input nodes of the macro parity check matrix;
        estimating, for each of the input nodes, over each of a plurality of parity check sums of the LDPC code, a check node value using values of other input nodes contributing to the parity check sum;
        estimating, for each of the input nodes, a probability value using the estimates of the check node values for that input node; and
        repeating the estimating operations to a termination criterion.

2. The spread spectrum processor of claim 1, wherein each permutation matrix corresponding to a non-zero entry of the macro matrix representing the LDPC code is a cyclically shifted identity matrix.

3. The spread spectrum processor of claim 2, wherein an offset for each of the cyclically shifted identity matrices corresponds to the block row and block column of the permutation matrix in the macro matrix representing the LDPC code.

4. The spread spectrum processor of claim 1, wherein the program instructions further comprise instructions for performing the operation of:
evaluating each of the plurality of parity check sums using decisions based upon the estimated probability values to determine whether the parity check sums are satisfied;
and wherein the termination criterion corresponds to each of the plurality of parity check sums being satisfied using decisions based upon the estimated probability values.

5. The spread spectrum processor of claim 1, wherein the program instructions further comprise:
generating an extrinsic estimate for each input node position for each parity check matrix row to which it contributes, after the probability values is estimated for each of the input nodes;
and wherein the program instructions for performing the operation of estimating a check node value for each of the input nodes over each of a plurality of parity check sums of the LDPC code comprises, for each corresponding row of the parity check matrix, program instructions for performing the operations of:
applying extrinsic estimates for the input nodes contributing to the parity check sum to a first look-up table to retrieve a corresponding first function value;
applying the first function values to an augmented adder to generate a full sum amplitude over the row;
for each contributing input node position, subtracting the first function value from the full sum amplitude;
applying the result of the subtracting step for each contributing input node position to a second look up table to retrieve a second function value; and
then correcting the sign of the second function value for each contributing input node position, using a logical combination of sign bit outputs from the first function values, to produce the estimates of the check node values.

6. The spread spectrum processor of claim 1, wherein the program instructions further comprise instructions for performing the operation of:
generating an extrinsic estimate for each input node position for each parity check matrix row to which it contributes, after probability values for each of the input nodes are estimated;
and wherein the program instructions for performing the operation of estimating a check node value for each of the input nodes over each of a plurality of parity check sums of the LDPC code comprises, for each corresponding row of the parity check matrix, program instructions further comprise instructions for performing the operation of:
performing a sum of log likelihood ratios of each of the extrinsic estimates of the contributing input node positions, the sum corresponding to a log ratio of exponentials of the extrinsic estimates.

7. The spread spectrum processor of claim 1, wherein the program instructions further comprise instructions for performing the operation of:
generating an extrinsic estimate for each input node position for each parity check matrix row to which it contributes, after probability values for each of the input nodes are estimated;
and wherein program instructions for performing the operation of estimating a check node value for each of the input nodes over each of a plurality of parity check sums of the LDPC code comprises, for each corresponding row of the parity check matrix, program instructions for performing the operation of:
receiving first and second portions of the extrinsic estimates for the contributing input nodes in successive cycles;
using the first and second portions of the extrinsic estimates to produce a sum over all of the contributing input nodes; and
producing, from the sum, first and second groups of the check node estimates in successive cycles.

8. The spread spectrum processor of claim 1, program instructions for performing the operation of estimating a probability value using the estimates of the check node values for that input node comprise program instructions for performing the operation of:
accumulating a plurality of check node value estimates for the input node, over each of the parity check sums to which the input node contributes;
then adding a stored value corresponding to the original received input value for the input node; and
forwarding the result of the adding step as a next estimate of the probability value for the input node.

9. A transceiver comprising:
a program memory for storing a sequence of operating instructions;
a macro matrix defining a Low Density Parity Check (LDPC) code said macro matrix having zero-valued and non-zero-valued entries arranged in block rows and block columns and in which each zero-valued entry corresponds to a p×p zero-valued matrix and each non-zero-valued entry corresponds to a p×p permutation matrix that has at most a single "1" entry in each row and each column and "0" entries elsewhere to define a parity check matrix, wherein the block columns of the macro matrix are grouped into groups of block columns so that at most one column in any group has a "1" entry in any row, at least one of the groups including more than one block column, and wherein the columns of the parity check matrix correspond to input nodes and the rows of the parity check matrix correspond to parity check sums;
local memory for code execution and data buffering;
a baseband processor coupled to said program memory and local memory for executing said sequence of operating instructions to perform a plurality of operations comprising:
receiving a set of input values corresponding to input nodes of the macro parity check matrix;
estimating, for each of the input nodes, over each of a plurality of parity check sums of the LDPC code, a check node value using values of other input nodes contributing to the parity check sum;
estimating, for each of the input nodes, a probability value using the estimates of the check node values for that input node; and
repeating the estimating operations to a termination criterion.

10. The transceiver of claim 9, wherein each permutation matrix corresponding to a non-zero entry of the macro matrix representing the LDPC code is a cyclically shifted identity matrix.

11. The transceiver of claim 10, wherein an offset for each of the cyclically shifted identity matrices corresponds to the block row and block column of the permutation matrix in the macro matrix representing the LDPC code.

12. The transceiver of claim 9, wherein the program instructions further comprise instructions for performing the operation of:
  evaluating each of the plurality of parity check sums using decisions based upon the estimated probability values to determine whether the parity check sums are satisfied;
  and wherein the termination criterion corresponds to each of the plurality of parity check sums being satisfied using decisions based upon the estimated probability values.

13. The transceiver of claim 9, wherein the program instructions further comprise:
  generating an extrinsic estimate for each input node position for each parity check matrix row to which it contributes, after the probability values is estimated for each of the input nodes;
  and wherein the program instructions for performing the operation of estimating a check node value for each of the input nodes over each of a plurality of parity check sums of the LDPC code comprises, for each corresponding row of the parity check matrix, program instructions for performing the operations of:
    applying extrinsic estimates for the input nodes contributing to the parity check sum to a first look-up table to retrieve a corresponding first function value;
    applying the first function values to an augmented adder to generate a full sum amplitude over the row;
    for each contributing input node position, subtracting the first function value from the full sum amplitude;
    applying the result of the subtracting step for each contributing input node position to a second look up table to retrieve a second function value; and
    then correcting the sign of the second function value for each contributing input node position, using a logical combination of sign bit outputs from the first function values, to produce the estimates of the check node values.

14. The transceiver of claim 9, wherein the program instructions further comprise instructions for performing the operation of:
  generating an extrinsic estimate for each input node position for each parity check matrix row to which it contributes, after probability values for each of the input nodes are estimated;
  and wherein the program instructions for performing the operation of estimating a check node value for each of the input nodes over each of a plurality of parity check sums of the LDPC code comprises, for each corresponding row of the parity check matrix, program instructions further comprise instructions for performing the operation of:
    performing a sum of log likelihood ratios of each of the extrinsic estimates of the contributing input node positions, the sum corresponding to a log ratio of exponentials of the extrinsic estimates.

15. The transceiver of claim 9, wherein the program instructions further comprise instructions for performing the operation of:
  generating an extrinsic estimate for each input node position for each parity check matrix row to which it contributes, after probability values for each of the input nodes are estimated;
  and wherein program instructions for performing the operation of estimating a check node value for each of the input nodes over each of a plurality of parity check sums of the LDPC code comprises, for each corresponding row of the parity check matrix, program instructions for performing the operation of:
    receiving first and second portions of the extrinsic estimates for the contributing input nodes in successive cycles;
    using the first and second portions of the extrinsic estimates to produce a sum over all of the contributing input nodes; and
    producing, from the sum, first and second groups of the check node estimates in successive cycles.

16. The transceiver of claim 9, program instructions for performing the operation of estimating a probability value using the estimates of the check node values for that input node comprise program instructions for performing the operation of:
  accumulating a plurality of check node value estimates for the input node, over each of the parity check sums to which the input node contributes;
  then adding a stored value corresponding to the original received input value for the input node; and
  forwarding the result of the adding step as a next estimate of the probability value for the input node.

* * * * *